United States Patent
Tanaka et al.

(10) Patent No.: US 9,926,462 B2
(45) Date of Patent: Mar. 27, 2018

(54) COMPOSITION FOR FORMING LIQUID IMMERSION UPPER LAYER FILM, AND POLYMER

(71) Applicant: JSR CORPORATION, Tokyo (JP)

(72) Inventors: Kiyoshi Tanaka, Tokyo (JP); Kazunori Kusabiraki, Tokyo (JP); Takahiro Hayama, Tokyo (JP); Motoyuki Shima, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/358,250

(22) Filed: Nov. 22, 2016

(65) Prior Publication Data

US 2017/0073541 A1 Mar. 16, 2017

Related U.S. Application Data

(60) Division of application No. 13/852,194, filed on Mar. 28, 2013, now Pat. No. 9,540,535, which is a
(Continued)

(30) Foreign Application Priority Data

Sep. 29, 2010 (JP) .................................. 2010-219858
Mar. 31, 2011 (JP) .................................. 2011-081337

(51) Int. Cl.
| | | |
|---|---|---|
| *C08F 16/34* | (2006.01) | |
| *C08F 16/36* | (2006.01) | |
| *C08F 16/38* | (2006.01) | |
| *C09D 135/02* | (2006.01) | |
| *C08F 20/28* | (2006.01) | |
| *G03F 7/11* | (2006.01) | |

(Continued)

(52) U.S. Cl.
CPC ............ *C09D 135/02* (2013.01); *C08F 20/28* (2013.01); *C08F 220/28* (2013.01); *C09D 133/16* (2013.01); *G03F 7/11* (2013.01); *G03F 7/2041* (2013.01); *C08F 2220/281* (2013.01)

(58) Field of Classification Search
CPC .......... G03F 7/11; G03F 7/2041; C08F 20/28; C08F 16/34; C08F 16/36; C08F 16/38; C09D 133/16
See application file for complete search history.

(56) References Cited

U.S. PATENT DOCUMENTS

| | | | |
|---|---|---|---|
| 4,365,040 A | 12/1982 | Eck et al. | |
| 2006/0008748 A1 * | 1/2006 | Inabe | .............. G03F 7/2041 430/326 |

(Continued)

FOREIGN PATENT DOCUMENTS

| | | | |
|---|---|---|---|
| CA | 1094742 A1 | 1/1981 | |
| EP | 1806370 A1 * | 7/2007 | ............ C08F 220/18 |

(Continued)

OTHER PUBLICATIONS

International Search Report for corresponding International Application No. PCT/JP2011/072460, dated Dec. 20, 2011 (w/ English translation).

(Continued)

*Primary Examiner* — Karuna P Reddy
(74) *Attorney, Agent, or Firm* — Oblon, McClelland, Maier & Neustadt, L.L.P.

(57) ABSTRACT

An immersion upper layer film-forming composition includes [A] a polymer component that includes a polymer (A1), and [B] a solvent, the polymer (A1) including a structural unit (I) that includes a group represented by the following formula (i). The structural unit (I) is preferably a structural unit (I-1) represented by the following formula (1). The polymer component [A] preferably further includes a structural unit (II-1) represented by the following formula (2), the structural unit (II-1) being included in the polymer (A1) or a polymer other than the polymer (A1). The polymer component [A] preferably further includes a structural unit (III) that includes a carboxyl group, the structural unit (III) being included in the polymer (A1) or a polymer other than the polymer (A1).

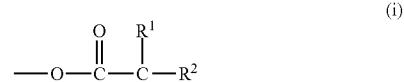

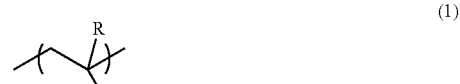

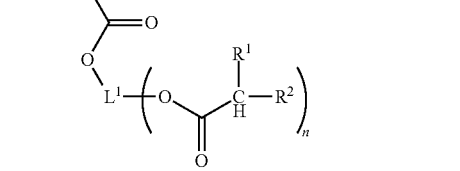

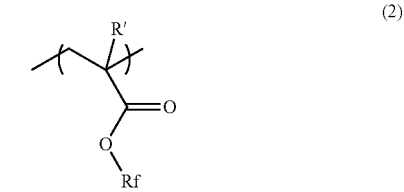

15 Claims, No Drawings

Related U.S. Application Data continuation of application No. PCT/JP2011/072460, filed on Sep. 29, 2011.

(51) Int. Cl.
*G03F 7/20* (2006.01)
*C09D 133/16* (2006.01)
*C08F 220/28* (2006.01)

(56) References Cited

U.S. PATENT DOCUMENTS

| | | | |
|---|---|---|---|
| 2009/0093560 A1 | 4/2009 | Van Rheenen et al. | |
| 2009/0136878 A1* | 5/2009 | Kanna | C08L 33/26 430/325 |
| 2009/0286182 A1* | 11/2009 | Harada | C08F 220/24 430/285.1 |
| 2010/0255416 A1* | 10/2010 | Kouno | G03F 7/11 430/270.1 |

FOREIGN PATENT DOCUMENTS

| | | | | |
|---|---|---|---|---|
| JP | S52-133395 A | 11/1977 | | |
| JP | S56-076418 A | 6/1981 | | |
| JP | S58-098313 A | 6/1983 | | |
| JP | 06-12452 B2 | 5/1984 | | |
| JP | 07292039 | 11/1995 | | |
| JP | H09-003127 A | 1/1997 | | |
| JP | H09-003128 A | 1/1997 | | |
| JP | H11-012325 A | 1/1999 | | |
| JP | 2003330194 A | * | 11/2003 | |
| JP | 2006-023538 | 1/2006 | | |
| JP | 2006-030603 | 2/2006 | | |
| JP | 2006-091798 | 4/2006 | | |
| JP | 2006-171667 A | 6/2006 | | |
| JP | 2007-284368 | 11/2007 | | |
| JP | 2008-309878 | 12/2008 | | |
| JP | 2015-052115 A | 3/2015 | | |
| JP | 2015-057477 A | 3/2015 | | |
| WO | WO 2008/047678 | 4/2008 | | |
| WO | WO 2009/041270 | 4/2009 | | |
| WO | WO 2009041270 A1 | * | 4/2009 | G03F 7/11 |

OTHER PUBLICATIONS

Korean Office Action for corresponding KR Application No. 10-2012-7030976, dated Mar. 19, 2013 (w/ English translation).
Korean Office Action for corresponding KR Application No. 10-2012-7030976, dated Jul. 5, 2013 (w/ English translation).
Korean Office Action for corresponding KR Application No. 10-2012-7030976, dated Sep. 12, 2013 (w/ English translation).
Office Action dated Jul. 22, 2014 in Japanese Patent Application No. 2012-536569 (w/ English translation).
Office Action dated Sep. 1, 2015, in Japanese Patent Application No. 2014-188325 (w/ English translation).
Office Action dated Sep. 1, 2015, in Japanese Patent Application No. 2014-188326 (w/ English translation).

* cited by examiner

COMPOSITION FOR FORMING LIQUID IMMERSION UPPER LAYER FILM, AND POLYMER

CROSS-REFERENCE TO RELATED APPLICATIONS

The present application is a divisional application of U.S. patent application Ser. No. 13/852,194 filed Mar. 28, 2013, which in turn is a continuation application of International Application No. PCT/JP2011/072460, filed Sep. 29, 2011, which claims priority to Japanese Patent Application No. 2010-219858, filed Sep. 29, 2010, and to Japanese Patent Application No. 2011-081337, filed Mar. 31, 2011. The contents of these applications are incorporated herein by reference in their entirety.

TECHNICAL FIELD

The invention relates to an immersion upper layer film-forming composition and a polymer. More specifically, the invention relates to an immersion upper layer film-forming composition that may be used to form an upper layer film that protects a resist film during liquid immersion lithography, and a novel polymer that may be useful as a component of the immersion upper layer film-forming composition.

BACKGROUND ART

A chemically-amplified resist has been used in the field of microfabrication such as the production of integrated circuit devices. The chemically-amplified resist is designed so that an acid is generated in an area exposed to short-wavelength radiation (e.g., excimer laser light), and a difference in solubility rate in an alkaline developer occurs between the exposed area and the unexposed area due to reactions catalyzed by the acid. A resist pattern is formed on a substrate by utilizing the difference in solubility rate.

In order to form a finer resist pattern using the chemically-amplified resist, liquid immersion lithography that exposes the resist film in a state in which an immersion medium (e.g., purified water or fluorine-containing inert liquid) is provided between the lens and the resist film, has become widespread. According to liquid immersion lithography, the numerical aperture (NA) of the lens can be increased. Moreover, the depth of focus decreases to only a small extent, and high resolution can be obtained even when the NA of the lens is increased.

When forming a resist pattern by liquid immersion lithography, it has been desired to suppress elution of the resist film composition into the immersion medium, suppress pattern defects due to liquid droplets that remain on the surface of the film, and improve the scan speed. A technique that provides a protective film between the resist film and the immersion medium has been proposed to meet such requirements (see Patent Documents 1 to 3). In Patent Documents 1 to 3, a protective film is formed on the resist film using a water-insoluble and alkali-soluble polymer to suppress elution of the resist film composition, pattern defects, and the like during liquid immersion lithography due to the water repellency of the protective film. The protective film is removed from the surface of the resist film by dissolving the protective film in a developer in the subsequent alkali development step. Patent Documents 1 to 3 disclose using a structural unit that includes a sulfo group as a component of the polymer.

It is desirable that the upper layer film have excellent water repellency. However, the solubility of the upper layer film in a developer may decrease as a result of improving the water repellency of the upper layer film. In this case, the resist may show defects such as bridge defects (i.e., the lines of the pattern are partially connected) and blob defect (i.e., defects due to adhesion of a development residue).

RELATED-ART DOCUMENT

Patent Document

Patent Document 1: Japanese Patent Application Publication (KOKAI) No. 2006-91798
Patent Document 2: WO2008/47678
Patent Document 3: WO2009/41270

SUMMARY OF THE INVENTION

Technical Problem

The invention was conceived in view of the above situation. An object of the invention is to provide an immersion upper layer film-forming composition that may form an immersion upper layer film that exhibits excellent water repellency and excellent solubility in a developer in a well-balanced manner, and suppresses defects in a resist, and a polymer that may be useful as a component of the immersion upper layer film-forming composition.

Solution to Problem

The inventors of the invention conducted extensive studies in order to solve the above problems. As a result, the inventors found that the above problems can be solved by utilizing a polymer that includes a structural unit that includes a specific group as a nonpolar unit that can be dissolved in developer, as a component of an immersion upper layer film-forming composition. This finding has led to completion of the invention.

According to one aspect of the invention, an immersion upper layer film-forming composition includes [A] a polymer component that includes a polymer (A1) (hereinafter may be referred to as "polymer component [A]"), and [B] a solvent, the polymer (A1) including a structural unit (I) that includes a group represented by the following formula (i) (hereinafter may be referred to as "group (i)").

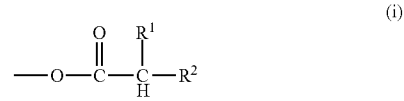

wherein $R^1$ is a hydrogen atom, a halogen atom, a nitro group, an alkyl group, a monovalent alicyclic hydrocarbon group, an alkoxy group, an acyl group, an aralkyl group, or an aryl group, wherein some or all of hydrogen atoms of the alkyl group, the alicyclic hydrocarbon group, the alkoxy group, the acyl group, the aralkyl group, and the aryl group are not substituted or substituted by a substituent, $R^2$ is $-C(=O)-R^3$, $-S(=O)_2-R^4$, $-R^5-CN$, or $-R^6-NO_2$, wherein $R^3$ and $R^4$ are each independently a hydrogen atom, an alkyl group, a fluoroalkyl group, a monovalent alicyclic hydrocarbon group, an alkoxy group, a cyano group, a cyanomethyl group, an aralkyl group, or an aryl group, or $R^3$ or $R^4$ and $R^1$ taken together represent a cyclic structure, and $R^5$ and $R^6$ are each independently a single bond, a methylene group, or an alkylene group having 2 to 5 carbon atoms.

Since the immersion upper layer film-forming composition includes the polymer component [A] that includes the structural unit (I) that includes the group (i), the resulting upper layer film exhibits excellent solubility in a developer. This makes it possible to suppress a situation in which the upper layer film remains undissolved, or the resist shows defects (e.g., bridge defects and blob defects) due to a development residue. Since the immersion upper layer film-forming composition exhibits excellent water repellency during liquid immersion lithography due to the structural unit (I), it is possible to suppress defects (e.g., water mark defects) due to liquid immersion lithography, suppress elution of a substance from the resist film, and improve the scan speed. Since the polymer component [A] exhibits excellent solubility in the solvent [B] due to the group (i), formation of a foreign substance with the passage of time can be suppressed (i.e., excellent storage stability can be achieved). An upper layer film formed using the immersion upper layer film-forming composition exhibits excellent adhesion to a substrate and the like (i.e., exhibits excellent separation resistance) due to the group (i).

The structural unit (I) is preferably a structural unit (I-1) represented by the following formula (1).

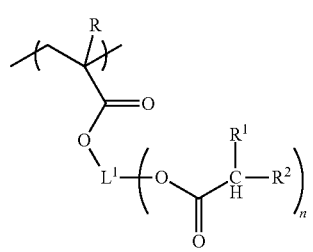

(1)

wherein $R^1$ and $R^2$ are as defined in the formula (i), n is an integer from 1 to 3, in a case where $R^1$ is present in a plurality of number, the plurality of R's are each identical or different, and in a case where $R^2$ is present in a plurality of number, the plurality of $R^2$s are each identical or different, $L^1$ is an (n+1)-valent linking group, and R is a hydrogen atom, a methyl group, a fluorine atom, or a trifluoromethyl group.

When the structural unit (I) has the above specific structure, it is possible to increase the content of the structural unit (I) in the polymer component [A]. As a result, the above advantageous effects can be improved. Moreover, a monomer that produces the structural unit (I) can be relatively easily synthesized.

The polymer component [A] preferably further includes a structural unit (II-1) represented by the following formula (2), the structural unit (II-1) being included in the polymer (A1) or a polymer other than the polymer (A1).

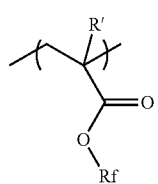

(2)

wherein R' is a hydrogen atom, a methyl group, a fluorine atom, or a trifluoromethyl group, and Rf is a monovalent fluorohydrocarbon group that is unsubstituted or substituted with a hydroxyl group.

The hydrophobicity of the polymer component [A] can be adjusted by incorporating the structural unit (II-1) in the polymer component [A]. When the structural unit (II-1) is included in a polymer (A2) other than the polymer (A1), the immersion upper layer film-forming composition includes the polymer (A1) that exhibits high solubility in a developer, and the polymer (A2) that exhibits high water repellency as the polymer component [A]. The polymer (A1) tends to be distributed in the area of the upper layer film adjacent to the resist film, and the polymer (A2) tends to be distributed in the surface area of the upper layer film opposite to the resist film. In this case, the polymer (A1) suppresses defects that may occur when the upper layer film remain undissolved, and the polymer (A2) suppresses defects that may occur due to liquid immersion lithography. When the polymer (A1) includes a carboxyl group or a sulfo group, the resist film is moderately removed when the polymer (A1) is distributed in the area of the upper layer film adjacent to the resist film, so that blob defects and the like can be further suppressed. Since the polymer (A2) exhibits high water repellency even when the polymer component [A] includes the polymer (A2) in combination with the polymer (A1), an upper layer film that exhibits high water repellency can be obtained.

The polymer component [A] preferably further includes a structural unit (III) that includes a carboxyl group, the structural unit (III) being included in the polymer (A1) or a polymer other than the polymer (A1). When the polymer component [A] includes the structural unit (III), the solubility in a developer is improved, and blob defects and the like can be further suppressed. When the structural unit (III) is included in the polymer (A1), the solubility in a developer is further improved, and blob defects and the like can be further suppressed.

The polymer component [A] preferably further includes a structural unit (IV) that includes a sulfo group, the structural unit (IV) being included in the polymer (A1) or a polymer other than the polymer (A1). When the polymer component [A] further includes the structural unit (IV) that includes a sulfo group, a positive-tone resist film can be moderately removed by a developer. Therefore, defects due to adhesion of a development residue can be advantageously suppressed. Moreover, the pattern shape of the resist is improved. When the structural unit (IV) is included in the polymer (A1), the polymer (A1) exhibits solubility in a developer and water repellency.

The solvent [B] preferably includes an ether solvent. The polymer component [A] that includes the group (i) is soluble in the solvent [B] that includes an ether solvent. When the solvent [B] includes an ether solvent, the viscosity of the immersion upper layer film-forming composition can be reduced. This makes it possible to effectively reduce the coating amount of the immersion upper layer film-forming composition, and reduce cost.

$R^1$ in the group represented by the formula (i) is preferably a halogen atom, a nitro group, an alkyl group, a monovalent alicyclic hydrocarbon group, an alkoxy group, an acyl group, an aralkyl group, an aryl group, or a group obtained by substituting a group among these groups with a substituent. When $R^1$ is the above specific group, the hydrophobicity of an upper layer film formed using the immersion upper layer film-forming composition can be further improved. This makes it possible to further improve the scan speed (achieve a high-speed scan), and further suppress elution from the resist film. Moreover, since the applicability of the immersion upper layer film-forming composition is improved, it is possible to effectively reduce the coating amount, and reduce cost.

$R^2$ in the group represented by the formula (i) is preferably —C(=O)—$R^{3f}$, —S(=O)$_2$—$R^4$, —$R^5$—CN, or —$R^6$—NO$_2$, wherein $R^{3f}$ is a fluoroalkyl group, $R^4$ is preferably a hydrogen atom, an alkyl group, a fluoroalkyl group, a monovalent alicyclic hydrocarbon group, an alkoxy group, an aralkyl group, or an aryl group, and $R^5$ and $R^6$ are preferably each independently a single bond, a methylene group, or an alkylene group having 2 to 5 carbon atoms. When $R^2$ is the above specific group, the hydrophobicity of an upper layer film formed using the immersion upper layer film-forming composition can be further improved. This makes it possible to further improve the scan speed (achieve a high-speed scan), and further suppress elution from the resist film.

According to another aspect of the invention, a polymer includes a structural unit (I) that includes a group represented by the following formula (i).

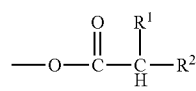

(i)

wherein $R^1$ is a hydrogen atom, a halogen atom, a nitro group, an alkyl group, a monovalent alicyclic hydrocarbon group, an alkoxy group, an acyl group, an aralkyl group, or an aryl group, wherein some or all of hydrogen atoms of the alkyl group, the alicyclic hydrocarbon group, the alkoxy group, the acyl group, the aralkyl group, and the aryl group are not substituted or substituted by a substituent, $R^2$ is —C(=O)—$R^3$, —S(=O)$_2$—$R^4$, —$R^5$—CN, or —$R^6$—NO$_2$, wherein $R^3$ and $R^4$ are each independently a hydrogen atom, an alkyl group, a fluoroalkyl group, a monovalent alicyclic hydrocarbon group, an alkoxy group, a cyano group, a cyanomethyl group, an aralkyl group, or an aryl group, or $R^3$ or $R^4$ and $R^1$ taken together represent a cyclic structure, and $R^5$ and $R^6$ are each independently a single bond, a methylene group, or an alkylene group having 2 to 5 carbon atoms.

Since the polymer exhibits moderate hydrophobicity and exhibits alkali-solubility, an immersion upper layer film formed using the polymer exhibits water repellency during liquid immersion lithography, and is dissolved in a developer during alkali development. Therefore, the polymer may suitably be used as a polymer that is included in an immersion upper layer film-forming composition as a polymer component.

The term "alicyclic hydrocarbon group" used herein refers to a hydrocarbon group that includes only an alicyclic hydrocarbon structure as a ring structure, and does not include an aromatic structure. Note that the alicyclic hydrocarbon group need not necessarily include only an alicyclic hydrocarbon structure, but may include a chain-like structure.

Advantageous Effects of the Invention

The immersion upper layer film-forming composition according to one aspect of the invention can form an immersion upper layer film that exhibits excellent water repellency and excellent solubility in a developer in a well-balanced manner, and suppresses defects in a resist. The polymer according to one aspect of the invention may be useful as a component of the immersion upper layer film-forming composition according to one aspect of the invention.

DESCRIPTION OF EMBODIMENTS

Immersion Upper Layer Film-Forming Composition

An immersion upper layer film-forming composition (hereinafter may be referred to as "upper layer film-forming composition") according to one embodiment of the invention includes the polymer component [A] and the solvent [B]. The upper layer film-forming composition may further include an optional component as long as the advantageous effects of the invention are not impaired. Each component is described below.

Polymer Component [A]

The polymer component [A] includes the polymer (A1). The polymer (A1) includes the structural unit (I) that includes the group represented by the formula (i).

Structural Unit (I)

The structural unit (I) includes the group (i). When the structural unit (I) includes the group (i), an upper layer film formed using the upper layer film-forming composition exhibits excellent solubility in a developer, and exhibits excellent water repellency during liquid immersion lithography.

In the formula (i), $R^1$ is a hydrogen atom, a halogen atom, a nitro group, an alkyl group, a monovalent alicyclic hydrocarbon group, an alkoxy group, an acyl group, an aralkyl group, or an aryl group, wherein some or all of hydrogen atoms of the alkyl group, the alicyclic hydrocarbon group, the alkoxy group, the acyl group, the aralkyl group, and the aryl group are not substituted or substituted by a substituent, $R^2$ is —C(=O)—$R^3$, —S(=O)$_2$—$R^4$, —$R^5$—CN, or —$R^6$—NO$_2$, wherein $R^3$ and $R^4$ are each independently a hydrogen atom, an alkyl group, a fluoroalkyl group, a monovalent alicyclic hydrocarbon group, an alkoxy group, a cyano group, a cyanomethyl group, an aralkyl group, or an aryl group, or $R^3$ or $R^4$ and $R^1$ taken together represent a cyclic structure, and $R^5$ and $R^6$ are each independently a single bond, a methylene group, or an alkylene group having 2 to 5 carbon atoms.

Examples of the halogen atom represented by $R^1$ include a fluorine atom, a chlorine atom, a bromine atom, an iodine atom, and the like. Among these, a fluorine atom and a chlorine atom are preferable.

The alkyl group represented by $R^1$ is preferably an alkyl group having 1 to 20 carbon atoms. Examples of the alkyl group represented by $R^1$ include linear alkyl groups such as a methyl group, an ethyl group, an n-propyl group, and an n-butyl group; branched alkyl groups such as an i-propyl group, an i-butyl group, a sec-butyl group, and a t-butyl group; and the like.

The monovalent alicyclic hydrocarbon group represented by $R^1$ is preferably an alicyclic hydrocarbon group having 3 to 20 carbon atoms. Examples of the monovalent alicyclic hydrocarbon group represented by $R^1$ include monoalicyclic hydrocarbon groups such as a cyclopentyl group and a cyclohexyl group; polyalicyclic hydrocarbon groups such as an adamantyl group, a norbornyl group, and a tetracyclodecanyl group; and the like. Note that the alicyclic hydrocarbon group need not necessarily be formed only of an alicyclic hydrocarbon structure, but may include a chain-like structure.

The alkoxy group represented by $R^1$ is preferably an alkoxy group having 1 to 20 carbon atoms. Examples of the alkoxy group represented by $R^1$ include a methoxy group, an ethoxy group, and the like.

The acyl group represented by $R^1$ is preferably an acyl group having 2 to 20 carbon atoms. Examples of the acyl group represented by $R^1$ include an acetyl group, a propionyl group, and the like.

The aralkyl group represented by R' is preferably an aralkyl group having 7 to 12 carbon atoms. Examples of the aralkyl group represented by $R^1$ include a benzyl group, a phenethyl group, a naphthylmethyl group, and the like.

The aryl group represented by $R^1$ is preferably an aryl group having 6 to 10 carbon atoms. Examples of the aryl group represented by $R^1$ include a phenyl group, a tolyl group, a dimethylphenyl group, a 2,4,6-trimethylphenyl group, a naphthyl group, and the like.

Examples of a substituent that may substitute the alkyl group, the monovalent alicyclic hydrocarbon group, the alkoxy group, the acyl group, the aralkyl group, and the aryl group represented by $R^1$ include a halogen atom (e.g., fluorine atom and chlorine atom), a hydroxyl group, a nitro group, a cyano group, and the like.

$R^1$ is preferably a hydrogen atom, a fluorine atom, an alkyl group having 1 to 5 carbon atoms, or an alkyl group having 1 to 5 carbon atoms that is substituted with a fluorine atom, and more preferably a hydrogen atom, a fluorine atom, a methyl group, an ethyl group, or a trifluoromethyl group, from the viewpoint of ensuring that an upper layer film formed using the upper layer film-forming composition exhibits solubility in a developer and water repellency during liquid immersion lithography in a well-balanced manner.

$R^1$ is preferably a halogen atom, a nitro group, an alkyl group, a monovalent alicyclic hydrocarbon group, an alkoxy group, an acyl group, an aralkyl group, an aryl group, or a group obtained by substituting a group among these groups with a substituent, from the viewpoint of improving the water repellency of an upper layer film formed using the upper layer film-forming composition, ensuring a high-speed scan, suppressing elution from a resist film, and improving the applicability of the upper layer film-forming composition to effectively reduce the application amount and reduce cost.

Examples of the alkyl group, the monovalent alicyclic hydrocarbon group, the alkoxy group, the aralkyl group, and the aryl group represented by $R^3$ and $R^4$ when $R^2$ is —C(=O)—$R^3$ or —S(=O)$_2$—$R^4$ include those mentioned above in connection with $R^1$. Examples of the fluoroalkyl group represented by $R^3$ and $R^4$ include groups obtained by substituting at least one hydrogen atom of the alkyl groups mentioned above in connection with $R^1$ with a fluorine atom.

$R^3$ and $R^4$ are preferably a hydrogen atom, an alkyl group, or a fluoroalkyl group, and more preferably a hydrogen atom, a methyl group, an ethyl group, a fluoromethyl group, or a trifluoromethyl group.

The group that includes the cyclic structure formed when $R^3$ or $R^4$ and $R^1$ bond to each other is preferably a divalent alicyclic hydrocarbon group that includes the carbon atom that is bonded to $R^3$ or $R^4$ and $R^1$, and includes an oxo group.

$R^5$ and $R^6$ when $R^2$ is —$R^5$—CN or —$R^6$—NO$_2$ are preferably a single bond, a methylene group, or an ethylene group.

It is preferable that $R^2$ be —C(=O)—$R^{3f}$, —S(=O)$_2$—$R^4$, —$R^5$—CN, or —$R^6$—NO$_2$, $R^{3f}$ be a fluoroalkyl group, $R^4$ be a hydrogen atom, an alkyl group, a fluoroalkyl group, a monovalent alicyclic hydrocarbon group, an alkoxy group, an aralkyl group, or an aryl group, and $R^5$ and $R^6$ each independently be a single bond, a methylene group, or an alkylene group having 2 to 5 carbon atoms, from the viewpoint of improving the water repellency of an upper layer film formed using the upper layer film-forming composition, ensuring a high-speed scan, and suppressing elution from a resist film.

Examples of the fluoroalkyl group represented by $R^{3f}$ include groups obtained by substituting at least one hydrogen atom of the alkyl groups mentioned above in connection with $R^1$ with a fluorine atom.

Examples of the group (i) include the groups represented by the following formulas (i-1) to (i-24), and the like.

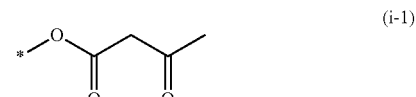

(i-1)

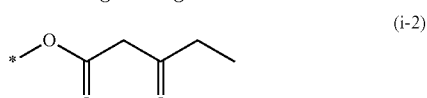

(i-2)

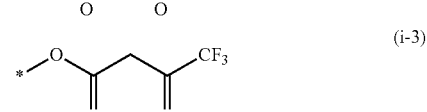

(i-3)

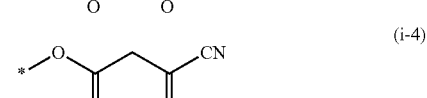

(i-4)

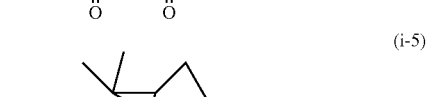

(i-5)

(i-6)

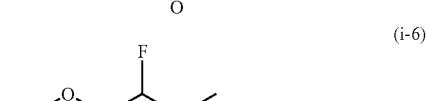

(i-7)

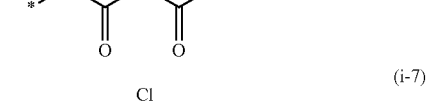

(i-8)

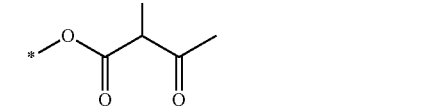

(i-9)

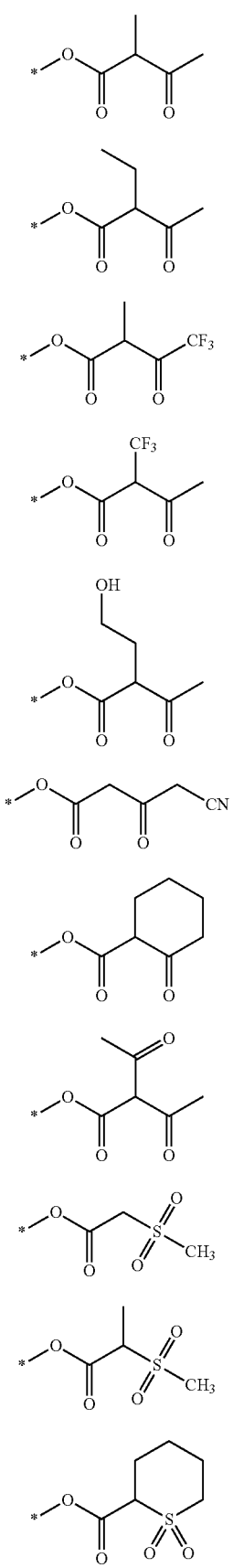
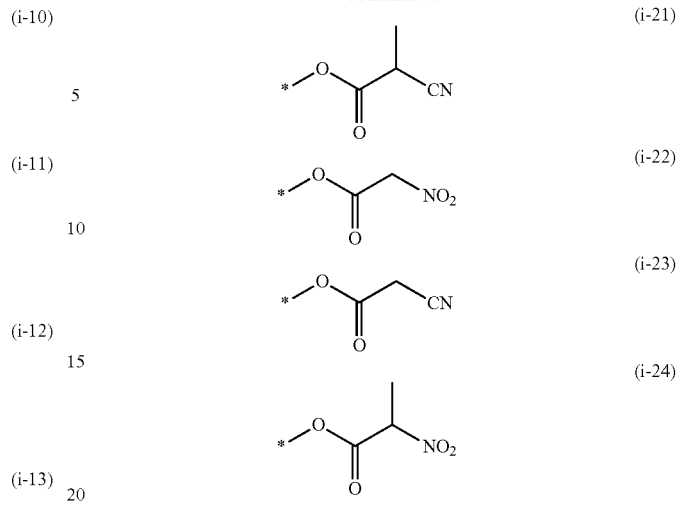

wherein "*" indicates a bonding site.

Among these, the groups represented by the formulas (i-1), (i-3), (i-6), (i-10), (i-11), (i-13), (i-18), (i-22), and (i-23) are preferable, and the groups represented by the formulas (i-3), (i-6), (i-10), (i-11), (i-13), (i-18), (i-22), and (i-23) are more preferable, since the hydrophobicity of the upper layer film can be improved.

Examples of the structural unit (I) that includes the group represented by the formula (i) include structural units derived from (meth)acrylate derivatives, (meth)acrylamide derivatives, vinyl ether derivatives, olefin derivatives, styrene derivatives, and the like that include the group (i). Among these, structural units derived from (meth)acrylate derivatives are preferable. Specifically, the structural unit (I-1) represented by the formula (1) is preferable as the structural unit (I).

In the formula (1), $R^1$ and $R^2$ are as defined in the formula (i), n is an integer from 1 to 3, in a case where $R^1$ is present in a plurality of number, the plurality of $R^1$s are each identical or different, and in a case where $R^2$ is present in a plurality of number, the plurality of $R^2$s are each identical or different, $L^1$ is an (n+1)-valent linking group, and R is a hydrogen atom, a methyl group, a fluorine atom, or a trifluoromethyl group.

Examples of the divalent linking group (i.e., when n is 1) represented by $L^1$ include a methylene group, an alkylene group, a divalent alicyclic hydrocarbon group, an alkenylene group, an arylene group, and the like. Note that these groups are not substituted or substituted with a halogen atom (e.g., fluorine atom or chlorine atom), a cyano group, or the like.

The alkylene group is preferably a linear or branched alkylene group having 2 to 8 carbon atoms. Examples of the alkylene group include an ethylene group, a propylene group, a butylene group, a hexylene group, an octylene group, and the like.

The divalent alicyclic hydrocarbon group is preferably an alicyclic hydrocarbon group having 5 to 12 carbon atoms. Examples of the divalent alicyclic hydrocarbon group represented by $R^1$ include monoalicyclic hydrocarbon groups such as a cyclopentylene group and a cyclohexylene group; polyalicyclic hydrocarbon groups obtained by removing one hydrogen atom from different carbon atoms of polycyclic hydrocarbons such as norbornane and adamantane; and the like.

The alkenylene group is preferably an alkenylene group having 2 to 6 carbon atoms. Examples of the alkenylene group include an ethenylene group, a propenylene group, a butenylene group, and the like.

The arylene group is preferably an arylene group having 6 to 15 carbon atoms. Examples of the arylene group include a phenylene group, a tolylene group, a naphthylene group, and the like.

$L^1$ is preferably a methylene group, an alkylene group, or a divalent alicyclic hydrocarbon group, and more preferably a methylene group, an alkylene group having 2 to 4 carbon atoms, or a divalent alicyclic hydrocarbon group having 6 to 11 carbon atoms. When $L^1$ is a divalent alicyclic hydrocarbon group, the water repellency of the resulting upper layer film can be improved.

R is preferably a hydrogen atom or a methyl group, and more preferably a methyl group.

Examples of the structural unit (I-1) include structural units represented by the following formulas (1-1) to (1-30).

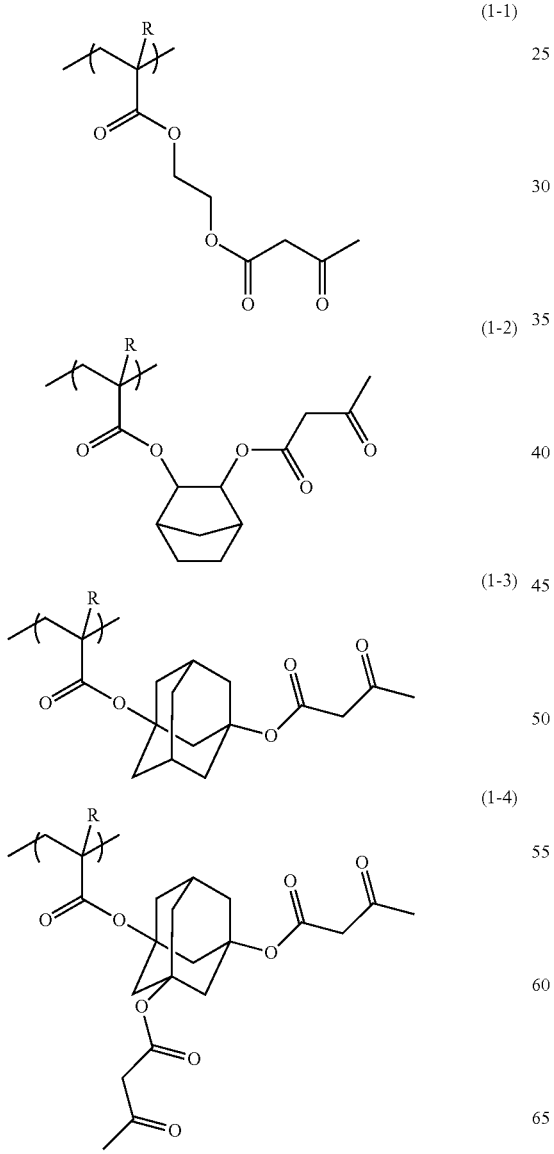

-continued

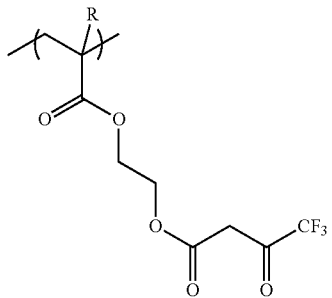

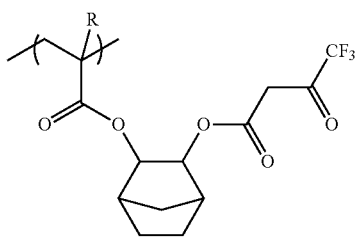

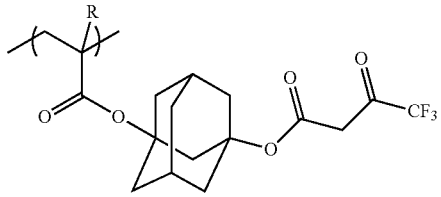

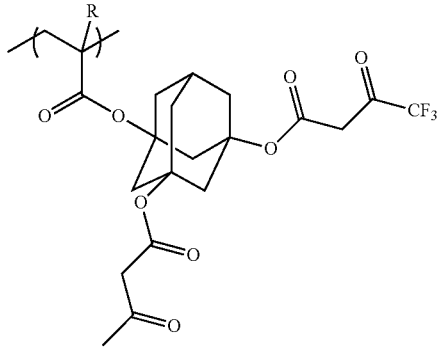

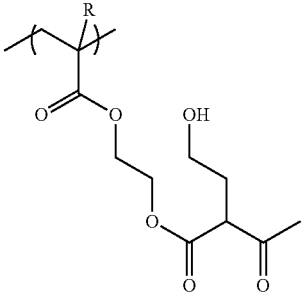

(1-10)
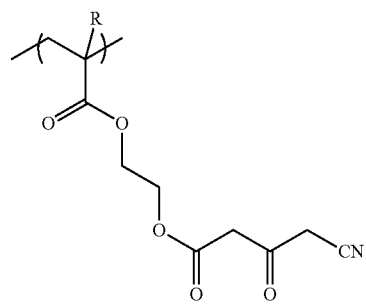
(1-11)
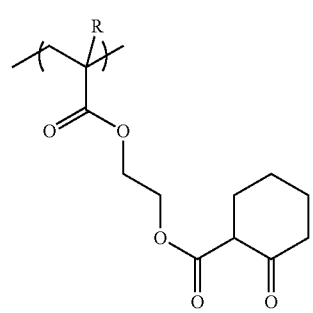
(1-12)
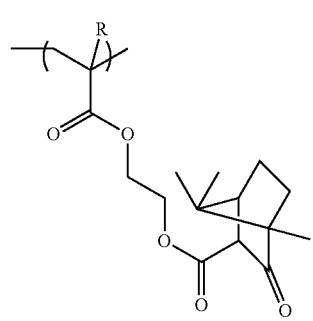
(1-13)
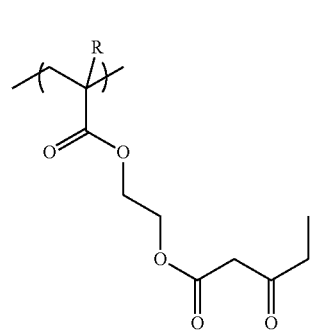
(1-14)
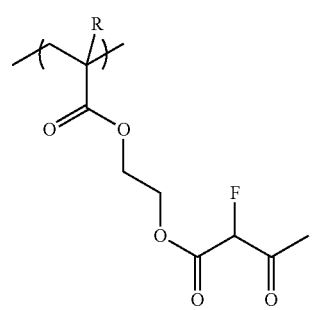
(1-15)
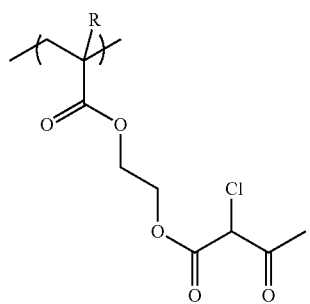
(1-16)
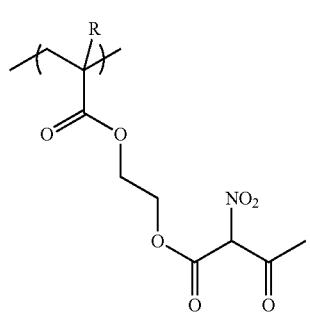
(1-17)
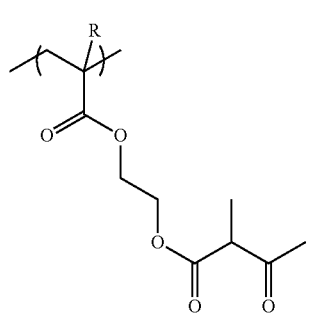
(1-18)
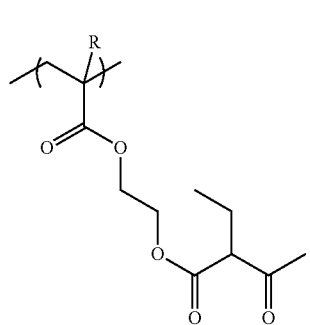
(1-19)
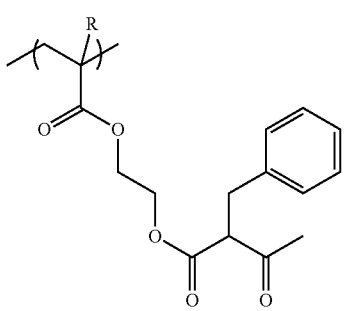

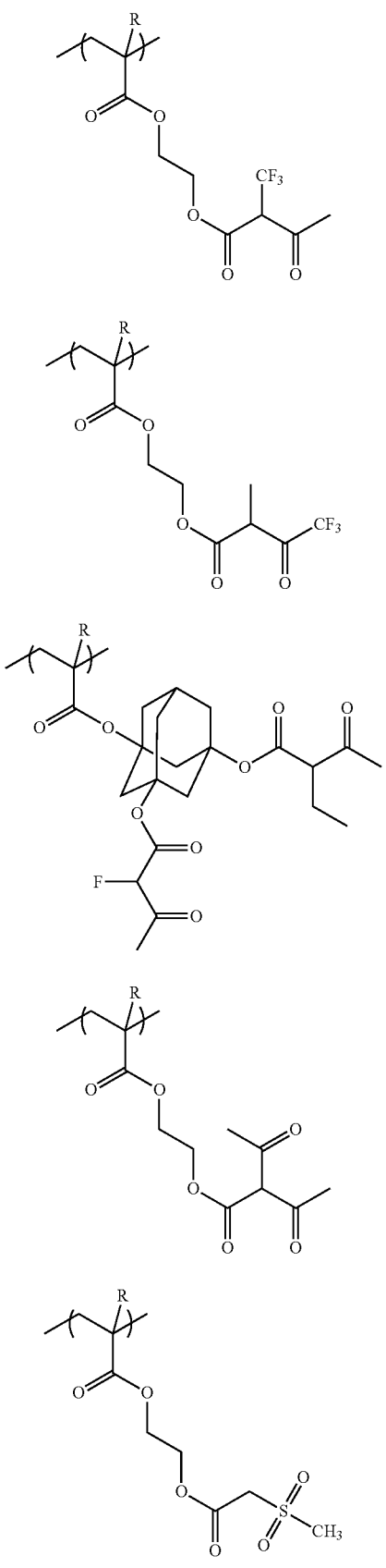

(1-30)

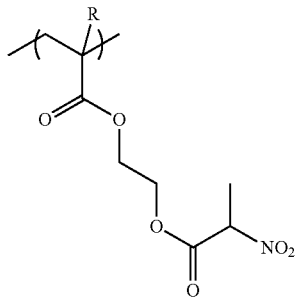

wherein R is as defined in the formula (1).

Among these, the structural units represented by the formulas (1-1), (1-5), (1-14), (1-17), (1-18), (1-20), (1-24), (1-27), and (1-29) are preferable, and the structural units represented by the formulas (1-5), (1-14), (1-17), (1-18), (1-20), (1-24), (1-27), and (1-29) are more preferable, since the hydrophobicity of an upper layer film formed using the upper layer film-forming composition can be improved.

The content of the structural unit (I) in the polymer component [A] is normally 0.5 to 50 mol %, preferably 1 to 45 mol %, and more preferably 3 to 40 mol %, based on the total structural units included in the polymer component [A]. When the content of the structural unit (I) is 0.5 mol % or more, the solubility of the polymer component [A] in a developer can be sufficiently improved. When the content of the structural unit (I) is 50 mol % or less, the solubility of the polymer component [A] in a solvent can be improved.

Structural Units (II) to (IV)

The polymer component [A] may include a structural unit (II) that includes a fluorine atom, a structural unit (III) that includes a carboxyl group, and/or a structural unit (IV) that includes a sulfo group in addition to the structural unit (I), each structural unit being included in the polymer (A1) or a polymer other than the polymer (A1). It is preferable that the polymer component [A] include at least one of the structural unit (II) and the structural unit (III). It is more preferable that the polymer component [A] include both the structural unit (II) and the structural unit (III).

Structural Unit (II)

The structural unit (II) is a structural unit that includes a fluorine atom (excluding a structural unit that falls under the structural unit (I)). The structural unit (II-1) represented by the formula (2) is preferable as the structural unit (II).

In the formula (2), R' is a hydrogen atom, a methyl group, a fluorine atom, or a trifluoromethyl group, and Rf is a monovalent fluorohydrocarbon group that is unsubstituted or substituted with a hydroxyl group.

R' is preferably a methyl group, a fluorine atom, or a trifluoromethyl group, more preferably a methyl group or a trifluoromethyl group, and still more preferably a methyl group.

Examples of the monovalent hydrocarbon group represented by Rf include monovalent fluorohydrocarbon groups, groups obtained by substituting one or more hydrogen atom of fluorohydrocarbon groups with a hydroxyl group, and the like.

Examples of the structural unit (II-1) include a structural unit (II-1-1) represented by the following formula (2-1), a structural unit (II-1-2) represented by the following formula (2-2), and the like.

(2-1)

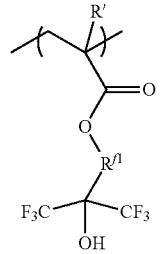

(2-2)

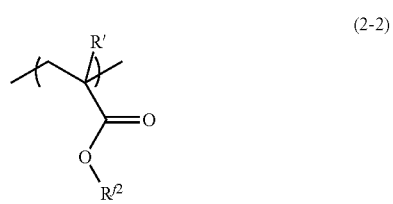

R' in the formulas (2-1) and (2-2) is as defined in the formula (2).

$R^{f1}$ in the formulas (2-1) is a divalent linking group.

$R^{f2}$ in the formulas (2-2) is a linear or branched monovalent fluorohydrocarbon group having 1 to 10 carbon atoms or a monovalent alicyclic fluorohydrocarbon group having 3 to 10 carbon atoms.

Examples of the divalent linking group represented by $R^{f1}$ include linear or branched divalent hydrocarbon groups having 1 to 6 carbon atoms, divalent alicyclic hydrocarbon groups having 4 to 12 carbon atoms, and the like (refer to the groups mentioned later in connection with $L^2$ in the formula (4)). The methylene group ($—CH_2—$) of the hydrocarbon group and the alicyclic hydrocarbon group are not substituted or substituted with an oxygen atom, a carbonyl group, or an ester group. $R^{f1}$ is preferably a linear or branched divalent hydrocarbon group having 1 to 3 carbon atoms, a divalent group that includes a norbornene skeleton, or a divalent group that includes an adamantane skeleton.

The fluorohydrocarbon group and the alicyclic fluorohydrocarbon group represented by $R^{f2}$ are preferably a linear or branched fluorohydrocarbon group having 2 to 8 carbon atoms and an alicyclic fluorohydrocarbon group having 4 to 8 carbon atoms.

Examples of the structural unit (II-1-1) include structural units represented by the following formulas (2-1-1) to (2-1-7), and the like.

(2-1-1)

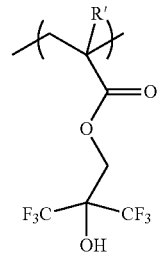

(2-1-2) 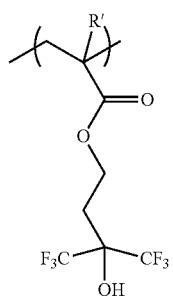
(2-1-3) 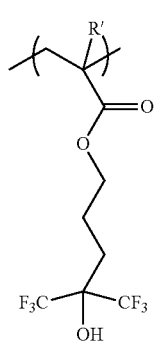
(2-1-4) 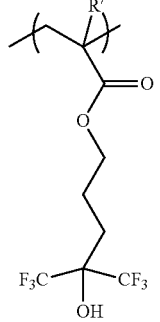
(2-1-5) 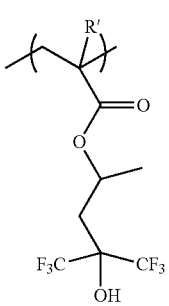
(2-1-6) 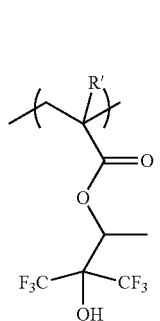
(2-1-7) 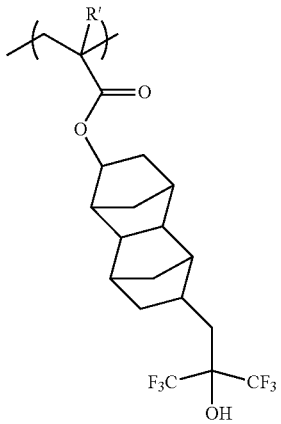
wherein R' is as defined in the formula (2).
Examples of the structural unit (II-1-2) include structural units represented by the following formulas (2-2-1) to (2-2-6), and the like.
(2-2-1) 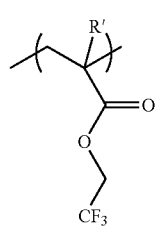
(2-2-2) 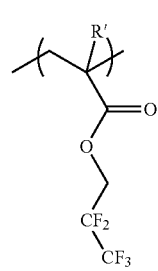
(2-2-3) 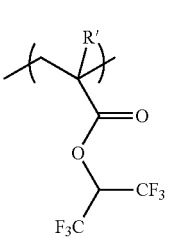
(2-2-4) 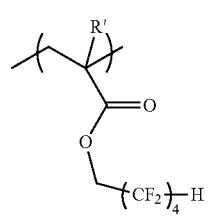

(2-2-5)

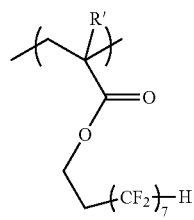

(2-2-6)

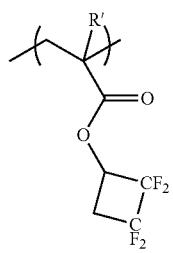

wherein R' is as defined in the formula (2).

The content of the structural unit (II) in the polymer component [A] is preferably 10 to 99 mol %, and more preferably 20 to 97 mol %, based on the total structural units included in the polymer component [A]. When the content of the structural unit (II) is 10 mol % or more, the polymer component [A] exhibits moderate solubility in an alkaline developer, and a situation in which the polymer remains undissolved can be suppressed.

Structural Unit (III)

The structural unit (III) is a structural unit that includes a carboxyl group. Examples of the structural unit (III) include structural units represented by the following formulas (3-1) to (3-3) (hereinafter may respectively be referred to as "structural units (III-1) to (III-3)"), and the like.

(3-1)

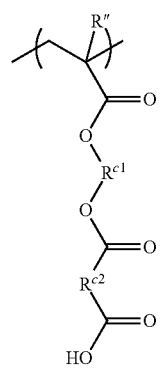

(3-2)

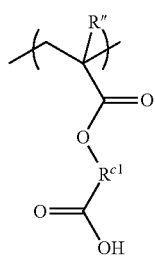

(3-3)

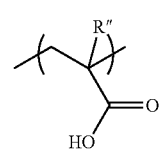

R″ in the formulas (3-1) to (3-3) is a hydrogen atom, a methyl group, a fluorine atom, or a trifluoromethyl group.

$R^{c1}$ and $R^{c2}$ in the formulas (3-1) and (3-2) are each independently a linear or branched divalent hydrocarbon group having 1 to 6 carbon atoms, a divalent alicyclic hydrocarbon group having 4 to 12 carbon atoms, or a divalent aromatic hydrocarbon group having 6 to 12 carbon atoms.

Examples of the linear or branched divalent hydrocarbon group having 1 to 6 carbon atoms, the divalent alicyclic hydrocarbon group having 4 to 12 carbon atoms, and the divalent aromatic hydrocarbon group having 6 to 12 carbon atoms represented by $R^{c1}$ and $R^{c2}$ include the groups mentioned later in connection with $L^2$ in the formula (4).

Examples of the structural unit (III-1) include structural units represented by the following formulas (3-1-1) and (3-1-2). Examples of the structural unit (III-2) include a structural unit represented by the following formula (3-1-3). Examples of the structural unit (III-3) include structural units represented by the following formulas (3-2-1) and (3-2-2).

(3-1-1)

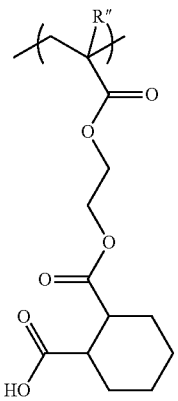

(3-1-2)

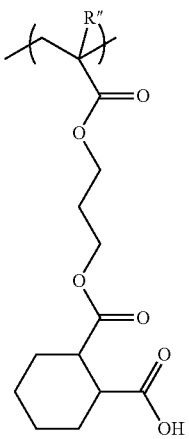

(3-1-3)

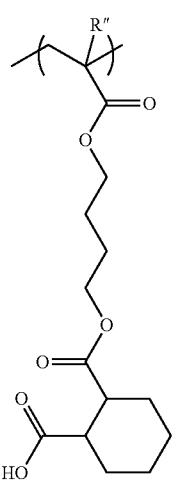

(3-2-1)

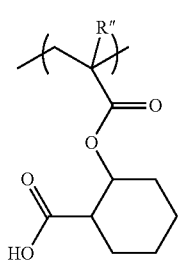

(3-2-2)

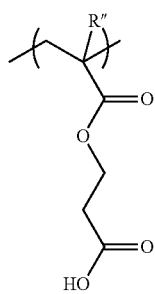

wherein R″ is as defined in the formulas (3-1) to (3-3).

The content of the structural unit (III) in the polymer component [A] is preferably 0.5 to 80 mol %, more preferably 1 to 60 mol %, and still more preferably 3 to 30 mol %, based on the total structural units included in the polymer component [A]. When the content of the structural unit (III) is 0.5 mol % or more, it is possible to suppress a situation in which the polymer component [A] remains undissolved (i.e., the number of defects can be reduced). When the content of the structural unit (III) is 80 mol % or less, the polymer component [A] exhibits moderate hydrophilicity, and the water repellency of the upper layer film can be improved.

Structural Unit (IV)

The structural unit (IV) is a structural unit that includes a sulfo group. Examples of the structural unit (IV) include a structural unit (IV-1) represented by the following formula (4).

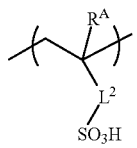

(4)

wherein $R^A$ is a hydrogen atom, a methyl group, a fluorine atom, or a trifluoromethyl group, $L^2$ is a single bond, an oxygen atom, a sulfur atom, a linear or branched divalent hydrocarbon group having 1 to 6 carbon atoms, a divalent alicyclic hydrocarbon group having 4 to 12 carbon atoms, a divalent aromatic hydrocarbon group having 6 to 12 carbon atoms, or —C(=O)—X—$R^7$—, X is an oxygen atom, a sulfur atom, or an NH group, and $R^7$ is a single bond, a linear or branched divalent hydrocarbon group having 1 to 6 carbon atoms, a divalent alicyclic hydrocarbon group having 4 to 12 carbon atoms, or a divalent aromatic hydrocarbon group having 6 to 12 carbon atoms.

The linear or branched divalent hydrocarbon group having 1 to 6 carbon atoms represented by $L^2$ and $R^7$ is preferably a saturated hydrocarbon group. Examples of the linear or branched divalent hydrocarbon group having 1 to 6 carbon atoms represented by $L^2$ and $R^7$ include a methylene group, an ethylene group, a 1,3-propylene group, a 1,2-propylene group, a 1,1-propylene group, a 2,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

The divalent alicyclic hydrocarbon group having 4 to 12 carbon atoms represented by $L^2$ and $R^7$ may be either monocyclic or polycyclic, and may include a crosslinked structure when the divalent alicyclic hydrocarbon group is polycyclic. Examples of the monocyclic hydrocarbon group include a cyclobutylene group (e.g., 1,3-cyclobutylene group), a cyclopentylene group (e.g., 1,3-cyclopentylene group), a cyclohexylene group (e.g., 1,4-cyclohexylene group), a cyclooctylene group (e.g., 1,5-cyclooctylene group)), and the like. Examples of the polycyclic hydrocarbon group include hydrocarbon groups that include a 2 to 4-membered ring such as a norbornylene group (e.g., 1,4-norbornylene group and 2,5-norbornylene group) and an adamantylene group (e.g., 1,5-adamantylene group and 2,6-adamantylene group).

Examples of the divalent aromatic hydrocarbon group having 6 to 12 carbon atoms represented by $L^2$ and $R^5$ include arylene groups such as a phenylene group and a tolylene group, and the like. Note that the alicyclic hydrocarbon group and the aromatic hydrocarbon group need not necessarily be formed only of a cyclic structure, but may include a chain-like structure.

$L^2$ is preferably a single bond, a linear or branched divalent hydrocarbon group having 1 to 6 carbon atoms, a divalent aromatic hydrocarbon group having 6 to 12 carbon atoms, or —C(=O)—X—$R^7$— wherein $R^7$ is a linear or branched divalent hydrocarbon group having 1 to 6 carbon atoms, and more preferably a single bond, a methylene group, a phenylene group, or —C(=O)—NH—C(CH$_3$)$_2$—CH$_2$—.

Examples of the structural unit (IV) include structural units represented by the following formulas (4-1) to (4-4), and the like.

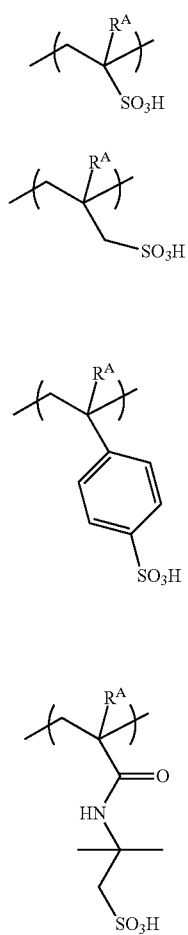

(4-1)

(4-2)

(4-3)

(4-4)

wherein $R^A$ is as defined in the formula (4).

The content of the structural unit (IV) in the polymer component [A] is normally 0.1 to 10 mol %, and preferably 0.5 to 5 mol %, based on the total structural units included in the polymer component [A]. When the content of the structural unit (IV) is 0.1 mol % or more, blob defects can be sufficiently suppressed since the amount of loss of the resist layer does not decrease to a large extent. When the content of the structural unit (IV) is 10 mol % or less, the resist layer exhibits etching resistance since the amount of loss of the resist layer does not increase to a large extent.

Additional Structural Unit

The polymer component [A] may include a structural unit derived from a (meth)acrylate (e.g., propyl (meth)acrylate, butyl (meth)acrylate, or lauryl (meth)acrylate) as an additional structural unit other than the structural units (I) to (IV) in order to improve the water repellency of the resulting upper layer film, for example. The polymer component [A] may also include a structural unit represented by the following formula (5) in order to improve the solubility of the resulting upper layer film in an alkaline developer. The polymer component [A] may also include a structural unit that includes an acid-labile group that dissociates due to an acid or another structural unit in order to control the molecular weight, the glass transition temperature, the solubility in a solvent, and the like of the polymer.

(5)

wherein $R^B$ is a hydrogen atom, a methyl group, a fluorine atom, or a trifluoromethyl group, $R^{n1}$ is a divalent linking group, and $R^{n2}$ is a fluoroalkyl group having 1 to 20 carbon atoms.

The structural units other than the structural unit (I) may be included in the polymer (A1), or may be included in a polymer other than the polymer (A1).

The content of the structural unit (I) in the polymer (A1) included in the polymer component [A] is normally 5 to 90 mol %, preferably 10 to 40 mol %, and more preferably 20 to 40 mol %, based on the total structural units included in the polymer (A1). When the content of the structural unit (I) is 5 mol % or more, the solubility of the polymer (A1) in a developer can be sufficiently improved. When the content of the structural unit (I) is 90 mol % or less, the solubility of the polymer (A1) in a solvent can be improved.

It is preferable that the polymer (A1) include the structural unit (III) and/or the structural unit (IV). When the polymer (A1) includes the structural unit (III) and/or the structural unit (IV), the solubility of the polymer (A1) in a developer can be further improved. Specifically, the structural unit (I) and the structural unit (III) and/or the structural unit (IV) allow the polymer component [A] to be dissolved in a developer, and the structural unit (I) improves the water repellency of the polymer component [A]. Even when the polymer (A1) includes the structural unit (III) and/or the structural unit (IV), the polymer component [A] exhibits excellent water repellency while maintaining solubility in a developer due to the structural unit (I). Note that the polymer (A1) may include an additional structural unit other than the structural units (II) to (IV).

The content of the structural unit (III) in the polymer (A1) is preferably 50 to 90 mol %, and more preferably 60 to 80 mol %, based on the total structural units included in the polymer (A1). When the content of the structural unit (III) is 50 mol % or more, it is possible to suppress a situation in which the polymer (A1) remains undissolved (i.e., the number of defects can be reduced). When the content of the structural unit (III) is 90 mol % or less, the polymer (A1) exhibits moderate hydrophilicity, and the water repellency of the upper layer film can be improved.

The polymer (A1) preferably includes the structural unit (IV). The content of the structural unit (IV) in the polymer (A1) is normally 1 to 10 mol %, and preferably 1 to 5 mol %, based on the total structural units included in the polymer (A1). When the content of the structural unit (IV) is 1 mol % or more, blob defects can be sufficiently suppressed since the amount of loss of the resist layer does not increase to a large extent. When the content of the structural unit (IV) is 10 mol % or less, the resist layer exhibits etching resistance since the amount of loss of the resist layer does not increase to a large extent.

The receding contact angle of the polymer (A1) with water when the polymer (A1) is formed into a film is preferably 55° or less, and more preferably 50° or less. Note that the term "receding contact angle" used herein refers to the contact angle formed by a liquid surface and a substrate that is measured by forming a film on a substrate using a resin composition that includes the polymer, dropping 25 μl of water onto the substrate, and suctioning the water at 10 μl/min. The receding contact angle may be measured using a contact angle meter ("DSA-10" manufactured by KRUS) (see the examples).

When the polymer component [A] includes two polymers, the content of the polymer (A1) in the polymer component [A] is preferably 60 to 95 mass %, and more preferably 70 to 90 mass %. When the content of the polymer (A1) is 60 mol % or more, the upper layer film exhibits an improved dissolution rate in an alkaline developer, and a situation in which the upper layer film remains undissolved can be suppressed (i.e., the number of defects can be reduced). When the content of the polymer (A1) is 95 mol % or less, a polymer (A2) exhibits high water repellency (when the polymer component [A] includes the polymer (A2)), and the upper layer film exhibits a high receding contact angle. When the polymer component [A] includes three polymers, the content of the polymer (A1) in the polymer component [A] is preferably 5 to 95 mass %, and more preferably 10 to 80 mass %.

Additional Polymer
Polymer (A2)

The polymer component [A] preferably further includes the polymer (A2) that has a water repellency higher than that of the polymer (A1). Specifically, the polymer component [A] preferably further includes the polymer (A2) that has a receding contact angle with water higher than that of the polymer (A1) when the polymer component [A] is formed into a film. In this case, the polymer (A2) is distributed in the surface area of the upper layer film, and the surface of the upper layer film exhibits a high contact angle (particularly a high receding contact angle) with a water droplet due to the water repellency of the polymer (A2). The polymer (A2) exhibits high water repellency even when the polymer component [A] includes the polymer (A2) in combination with the polymer (A1), and the water repellency of the upper layer film can be improved. The polymer (A1) is easily distributed at the interface between the resist film and the upper layer film, and defects can be suppressed due to a mixing layer formed at the interface. Moreover, a rectangular resist can be obtained regardless of the type of resist (i.e., the dependence of the shape of the resist can be reduced).

The receding contact angle of the polymer (A2) with water when the polymer (A2) is formed into a film is preferably 55° or more, more preferably 65° or more, and still more preferably 75° or more. The difference in receding contact angle between the polymer (A1) and the polymer (A2) is preferably 5° or more, more preferably 10 to 60°, and still more preferably 20 to 55°.

When the polymer component [A] includes the polymer (A2), and the polymer (A1) includes the structural unit (III), the mixing layer exhibits improved solubility in a developer (i.e., the number of defects can be further reduced).

It is preferable that the polymer (A2) have a fluorine atom content (mass %) higher than that of the polymer (A1). The polymer (A2) preferably includes the structural unit (II). The polymer (A2) may be (a) a homopolymer of the structural unit (II-1-1), (b) a copolymer of the structural unit (II-1-1) and the structural unit (II-1-2), (c) a copolymer of a structural unit derived from an alkyl (meth)acrylate and the structural unit (II-1-1), or the like. Specific examples of the polymer (A2) include a (1,1,1-trifluoro-2-trifluoromethyl-2-hydroxy-4-pentyl) methacrylate homopolymer, a (2,2,2-trifluoroethyl) methacrylate-(1,1,1-trifluoro-2-trifluoromethyl-2-hydroxy-4-pentyl) methacrylate copolymer, a (2,2,2-trifluoroethyl) methacrylate-(1,1,1-trifluoro-2-trifluoromethyl-2-hydroxy-4-pentyl) methacrylate copolymer, a butyl methacrylate-(1,1,1-trifluoro-2-trifluoromethyl-2-hydroxy-4-pentyl) methacrylate copolymer, a lauryl methacrylate-(1,1,1-trifluoro-2-trifluoromethyl-2-hydroxy-4-pentyl) methacrylate copolymer, a (1,1,1,3,3,3,-hexafluoro-2-propyl) methacrylate-(1,1,1-trifluoro-2-trifluoromethyl-2-hydroxy-4-pentyl) methacrylate copolymer, and the like. These polymers may be used either alone or in combination. The polymer (A2) may include the structural unit (III), the structural unit (IV), and the like in addition to the structural unit (II).

The content of the polymer (A2) in the polymer component [A] is preferably 5 to 40 mass %, and more preferably 10 to 30 mass %. When the content of the polymer (A2) is within the above range, the receding contact angle can be moderately increased (i.e., the number of defects can be further reduced).

The polymer component [A] may include a polymer other than the polymer (A2) as the additional polymer. Examples of such a polymer include a polymer (A3) that has a fluorine atom content that is lower than that of the polymer (A2), but is higher than that of the polymer (A1). Examples of the polymer (A3) include a copolymer that includes an alkali-soluble group (e.g., structural unit (II-1-1)) and the structural unit (IV), and the like.

Note that the polymer component [A] need not necessarily include the additional polymer. The polymer component [A] may include only the polymer (A1). In this case, the polymer (A1) exhibits excellent water repellency during liquid immersion lithography due to water-insolubility of the structural unit (I). The polymer (A1) is dissolved in a developer during alkali development due to the effects of the structural unit (I) (i.e., alkali-soluble group), and the effects of the structural units (III), (IV), and the like (i.e., acidic group). It is preferable that the structural unit (I) include a fluorine atom. It is more preferable that at least one of $R^1$ and $R^2$ in the structural unit (I) include a fluorine atom.

Synthesis of Polymer Component [A]

Each polymer included in the polymer component [A] may be synthesized by radically polymerizing one or more corresponding radically polymerizable monomers in a polymerization solvent in the presence of an initiator and a chain transfer agent, for example.

Examples of the polymerization solvent include alcohols such as methanol, ethanol, 1-propanol, 2-propanol, 1-butanol, and 2-butanol, ethylene glycol, diethylene glycol, and propylene glycol; cyclic ethers such as tetrahydrofuran and dioxane; alkyl ethers of polyhydric alcohols such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohols such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate; and the like. Among these, cyclic ethers, alkyl ethers of polyhydric alcohols, alkyl ether acetates of polyhydric alcohols, ketones, and esters are preferable. These polymerization solvents may be used either alone or in combination.

The weight average molecular weight (Mw) of the polymer component [A] is preferably 2000 to 100,000, more preferably 2500 to 50,000, and still more preferably 3000 to 20,000. When the Mw of the polymer component [A] is 2000 or more, the water resistance and the mechanical properties of the upper layer film can be improved. When the Mw of the polymer component [A] is 100,000 or less, the polymer is easily dissolved in a solvent.

The ratio (Mw/Mn) of the Mw to the number average molecular weight (Mn) of the polymer component [A] is preferably 1 to 5, and more preferably 1 to 3. Note that the weight average molecular weight and the number average molecular weight refer to polystyrene-reduced values determined by gel permeation chromatography (GPC).

It is preferable that the polymer component [A] have an impurity (e.g., halogen ions and metals) content as low as possible. Applicability and solubility in an alkaline developer can be further improved by reducing the impurity content in the polymer component [A]. The polymer component [A] may be purified by chemical purification (e.g., washing with water, liquid-liquid extraction, or use of a demetallation filter), a combination of chemical purification and physical purification (e.g., ultrafiltration or centrifugation), or the like.

The polymer component [A] included in the upper layer film-forming composition can form an upper layer film (protective film) that is stable to an immersion medium (e.g., water) (i.e., exhibits high water resistance) during irradiation, and can be dissolved in a developer used when forming a resist pattern. The expression "stable to an immersion medium" used herein means that a change in thickness equal to or less than 3% of the initial thickness is observed when water (e.g., ultrapure water) is discharged from a nozzle onto a film formed using the upper layer film-forming composition for a given time (e.g., 60 seconds), and the film is spin-dried at a given rotational speed (e.g., 4000 rpm) for a given time (e.g., 15 seconds).

Solvent [B]

The upper layer film-forming composition includes the solvent [B] that dissolves the polymer component [A] and the like. A solvent that rarely causes a deterioration in lithographic performance (e.g., due to excessive intermixing with the photoresist film) when the upper layer film-forming composition is applied to the photoresist film may preferably be used as the solvent [B].

Examples of the solvent [B] include alcohol solvents such as monohydric alcohols and polyhydric alcohols; ether solvents such as alkyl ethers of polyhydric alcohols, alkyl ether acetates of polyhydric alcohols, aliphatic ethers, aliphatic-aromatic ethers, and cyclic ethers; hydrocarbon solvents such as higher hydrocarbons; ketone solvents; ester solvents; water; and the like.

Examples of the monohydric alcohols include butyl alcohol, pentanol, and the like.

Examples of polyhydric alcohols include ethylene glycol, propylene glycol, and the like.

Examples of the alkyl ethers of polyhydric alcohols include ethylene glycol monomethyl ether, ethylene glycol monoethyl ether, ethylene glycol dimethyl ether, ethylene glycol methylethyl ether, ethylene glycol diethyl ether, diethylene glycol dimethyl ether, and the like.

Examples of the alkyl ether acetates of polyhydric alcohols include ethylene glycol monomethyl ether acetate, ethylene glycol monoethyl ether acetate, diethylene glycol monomethyl ether acetate, diethylene glycol monoethyl ether acetate, and the like.

Examples of the aliphatic ethers include diethyl ether, dipropyl ether, dibutyl ether, butyl methyl ether, butyl ethyl ether, diisoamyl ether, hexyl methyl ether, octyl methyl ether, cyclopentyl methyl ether, dicyclopentyl ether, and the like.

Examples of the aliphatic-aromatic ethers include anisole, phenyl ethyl ether, and the like.

Examples of the cyclic ethers include tetrahydrofuran, tetrahydropyran, dioxane, and the like.

Examples of the higher hydrocarbons include decane, dodecene, undecane, and the like.

Examples of the ketone solvents include acetone, methyl ethyl ketone, and the like.

Examples of the ester solvents include ethyl acetate, butyl acetate, and the like.

Among these, the alcohol solvents, the ether solvents, and the hydrocarbon solvents are preferable, and the alcohol solvents and the ether solvents are more preferable. Note that the ether solvents are still more preferable since it is possible to reduce the viscosity of the upper layer film-forming composition to effectively reduce the application amount and reduce cost.

Monohydric alcohols are preferable as the alcohol solvent. Aliphatic ethers, cyclic ethers, alkyl ethers of polyhydric alcohols, and alkyl ether acetates of polyhydric alcohols are preferable as the ether solvent. It is more preferable to use a solvent that includes at least one of a monohydric alcohol having 4 to 10 carbon atoms and an aliphatic ether that includes an alkyl chain having 4 to 10 carbon atoms. It is particularly preferable to use a solvent that includes 4-methyl-2-pentanol and diisoamyl ether.

When the solvent [B] includes a monohydric alcohol having 4 to 10 carbon atoms and an aliphatic ether that includes an alkyl chain having 4 to 10 carbon atoms, the mixing ratio (mass ratio) of the monohydric alcohol having 4 to 10 carbon atoms to the aliphatic ether that includes an alkyl chain having 4 to 10 carbon atoms is preferably 1:99 90:10, more preferably 2:98 to 70:30, still more preferably 5:95 to 60:40, and particularly preferably 10:90 to 50:50.

Optional Component

The upper layer film-forming composition may include an optional component in addition to the polymer component [A] and the solvent [B]. Example of the optional component include a surfactant and the like.

Examples of the surfactant include commercially available fluorine-based surfactants such as BM-1000, BM-1100 (manufactured by BM Chemie), Megafac F142D, Megafac F172, Megafac F173, Megafac F183 (manufactured by DIC Corporation), and the like. The surfactant is preferably used in amount of 5 parts by mass or less based on 100 parts by mass of the polymer component [A].

Polymer

A polymer according to one embodiment of the invention includes the structural unit (I) that includes the group represented by the formula (i).

In the formula (i), $R^1$ is a hydrogen atom, a halogen atom, a nitro group, an alkyl group, a monovalent alicyclic hydrocarbon group, an alkoxy group, an acyl group, an aralkyl group, or an aryl group, wherein some or all of the hydrogen atoms of the alkyl group, the alicyclic hydrocarbon group, the alkoxy group, the acyl group, the aralkyl group, and the aryl group are not substituted or substituted by a substituent, $R^2$ is —C(=O)—$R^3$, —S(=O)$_2$—$R^4$, —$R^5$—CN, or —$R^6$—NO$_2$, wherein $R^3$ and $R^4$ are each independently a hydrogen atom, an alkyl group, a fluoroalkyl group, a monovalent alicyclic hydrocarbon group, an alkoxy group, a cyano group, a cyanomethyl group, an aralkyl group, or an aryl group, or $R^3$ or $R^4$ and $R^1$ taken together represent a cyclic structure, and $R^5$ and $R^6$ are each independently a single bond, a methylene group, or an alkylene group having 2 to 5 carbon atoms.

Since the polymer exhibits moderate hydrophobicity and exhibits alkali-solubility, an immersion upper layer film formed using the polymer exhibits water repellency during liquid immersion lithography, and is dissolved in a developer during alkali development. Therefore, the polymer may suitably be used as a polymer that is included in an immersion upper layer film-forming composition as a polymer component.

The description given above in connection with the polymer component [A] included in the immersion upper layer film-forming composition is applied to the polymer. Therefore, further description thereof is omitted.

Method for Forming Photoresist Pattern

An immersion upper layer film is formed on a resist film (photoresist film) using the immersion upper layer film-forming composition, the resist film (photoresist film) being used to form a pattern by applying radiation, for example. A resist pattern is formed in a state in which the immersion upper layer film is formed on the photoresist film. A method for forming a photoresist pattern according to one embodiment of the invention is described below.

The method for forming a photoresist pattern according to one embodiment of the invention includes applying a photoresist composition to a substrate to form a photoresist film (hereinafter may be referred to as "step (1)"), applying the upper layer film-forming composition to the photoresist film to form an upper layer film (hereinafter may be referred to as "step (2)"), and providing an immersion medium (immersion liquid) between the upper layer film and a lens, applying exposure light to the photoresist film and the upper layer film via the immersion medium and a mask having a given pattern, and developing the photoresist film to obtain a resist pattern (hereinafter may be referred to as "step (3)").

According to the above method for forming a photoresist pattern, it is possible to form an immersion upper layer film that exhibits sufficient transparency to light having the exposure wavelength (particularly 248 nm (KrF) or 193 nm (ArF)), can be formed on the photoresist film while suppressing excessive intermixing with the photoresist film, is rarely eluted into the immersion medium (e.g., water) during liquid immersion lithography (i.e., is stable), can form a high-resolution resist pattern, and has a sufficiently high receding contact angle. Specifically, it is possible to effectively suppress occurrence of bubble defects and pattern defect at a normal scan speed (e.g., 500 mm/s), and effectively suppress occurrence of such defects even at a high scan speed (e.g., 700 mm/s).

Step (1)

The step (1) includes applying the photoresist composition to the substrate to form a photoresist film. A silicon wafer, an aluminum-coated silicon wafer, or the like is normally used as the substrate. An organic or inorganic antireflective film may preferably be formed on the surface of the substrate in order to maximize the properties of the photoresist film (see Japanese Examined Patent Publication (KOKOKU) No. 6-12452, for example).

The type of the photoresist composition for forming the photoresist film is not particularly limited. A known photoresist composition for forming a photoresist film may be appropriately selected depending on the intended use of the resist. It is preferable to use a chemically-amplified resist material (photoresist composition) that includes (P) a polymer that includes an acid-labile group, and (Q) an acid generator (particularly a positive-tone resist material).

The content of a structural unit that includes an acid-labile group in the polymer (P) is preferably 30 to 60 mol % based on the total structural units included in the polymer (P). If the content of the structural unit that includes an acid-labile group is less than 30 mol %, the resolution of the resulting resist may deteriorate. If the content of the structural unit that includes an acid-labile group exceeds 60 mol %, the thickness of the resist film may significantly decrease after removing the upper layer film. Examples of the polymer (P) include a polymer that includes the following structural units (U-1), (U-2), and (U-3), a polymer that includes the following structural units (U-1), (U-2), and (U-4), a polymer that includes the following structural units (U-1), (U-3), and (U-5), and the like.

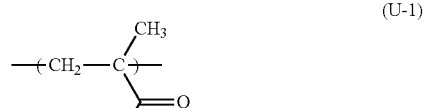
(U-1)

(U-2)

(U-3)

-continued

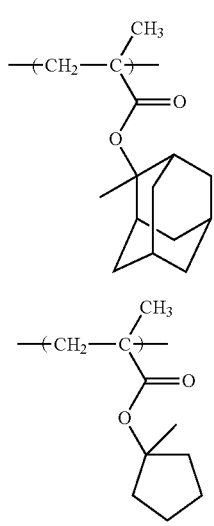

(U-4)

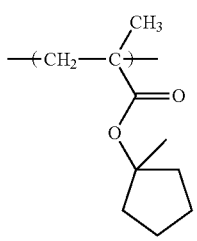

(U-5)

The acid generator (Q) generates an acid upon application of radiation (exposure), and the acid-labile group that protects an acidic group (e.g., carboxyl group) of the polymer dissociates due to the acid to produce an acidic group.

Examples of the acid generator (Q) include triphenylsulfonium nonafluoro-n-butane sulfonate, 4-cyclohexylphenyldiphenylsulfonium nonafluoro-n-butanesulfonate, 1-(4-n-butoxynaphthalcn-1-yl)tetrahydrothiophenium nonafluoro-n-butanesulfonate, triphenylsulfonium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethanesulfonate, and the like.

The photoresist film may be formed by applying the photoresist composition (total solid content: 0.2 to 20 mass %) that has been filtered through a filter having a pore size of about 30 nm, to the surface of the substrate by a known coating method (e.g., spin coating, cast coating, or roll coating), for example. The photoresist composition applied to the substrate may be prebaked (PB) in order to vaporize the solvent. The photoresist composition may be prepared as described above, or a commercially available photoresist composition may be used.

Step (2)

The step (2) includes applying the upper layer film-forming composition to the photoresist film to form an upper layer film. The step (2) preferably includes baking the upper layer film-forming composition applied to the photoresist film. A situation in which the immersion liquid comes in direct contact with the photoresist film can be prevented by forming the upper layer film on the photoresist film. This makes it possible to effectively prevent a situation in which the lithographic performance of the photoresist film deteriorates due to permeation of the immersion liquid, or the lens of a projection aligner is contaminated due to components eluted into the immersion liquid from the photoresist film. The upper layer film may be formed in the same manner as the photoresist film, except that the upper layer film-forming composition is used instead of the photoresist composition.

It is preferable that the thickness of the upper layer film be as close as possible to an odd multiple of $\lambda/4m$ (where, $\lambda$ is the wavelength of radiation, and m is the refractive index of the protective film). This makes it possible to increase the antireflective effect at the interface with the photoresist film.

Step (3)

The step (3) includes providing the immersion medium between the upper layer film and a lens, applying exposure light to the photoresist film and the upper layer film via the immersion medium and the mask having a given pattern, and developing the photoresist film to obtain a resist pattern.

A liquid having a refractive index higher than that of air is normally used as the immersion medium. It is preferable to use water (more preferably purified water) as the immersion medium. The pH of the immersion medium may optionally be adjusted. The upper layer film and the photoresist film are exposed by applying radiation to the upper layer film and the photoresist film via the mask having a given pattern using an exposure system in a state in which the immersion medium is provided between the lens of the exposure system and the upper layer film.

Radiation used for exposure (liquid immersion lithography) may be appropriately selected depending on the type of the photoresist film and the type of the upper layer film. For example, visible light, ultraviolet rays (e.g., g-line or i-line), deep ultraviolet rays (e.g., excimer laser light), X-rays (e.g., synchrotron radiation), charged particle rays (e.g., electron beams), or the like may be used. Among these, ArF excimer laser light (wavelength: 193 nm) and KrF excimer laser light (wavelength: 248 nm) are preferable. The exposure light application conditions (e.g., dose) may be appropriately set depending on the composition of the photoresist composition and/or the upper layer film-forming composition, the type of additive, and the like.

The exposed photoresist film is developed using a developer to form the desired photoresist pattern. According to the method for forming a photoresist pattern, since the upper layer film is formed using the upper layer film-forming composition, the upper layer film can be easily removed by the developer during development (or by a rinsing agent during rinsing after development). Specifically, it is unnecessary to separately provide a removal step that removes the upper layer film.

An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetraalkylammonium hydroxide (e.g., tetramethylammonium hydroxide (TMAH) and tetraethylammonium hydroxide), pyrrole, piperidine, choline, 1,8-diazabicyclo-[5.4.0]-7-undecene, and 1,5-diazabicyclo-[4.3.0]-5-nonane) in water is preferable as the developer. It is preferable to use a tetraalkylammonium hydroxide aqueous solution as the developer.

An appropriate amount of a water-soluble organic solvent (e.g., alcohol such as methanol or ethanol) or a surfactant may be added to the developer. After development using the alkaline aqueous solution, the photoresist film is preferably rinsed with water, and may be dried after rinsing.

It is preferable to perform post-exposure bake (PEB) before development in order to improve the resolution, the pattern shape, the developability, and the like of the photoresist film. The PEB temperature may be appropriately set depending on the type of the photoresist composition and/or the upper layer film-forming composition, and the like, but is preferably 30 to 200° C., and more preferably 50 to 150° C.

EXAMPLES

The invention is further described below by way of examples and comparative examples. Note that the invention is not limited to the following examples. In the examples, synthesis examples, and comparative examples, the unit "parts" refers to "parts by mass", and the unit "%" refers to "mass %", unless otherwise specified. The property values were measured by the following methods.

Weight Average Molecular Weight (Mw) and Number Average Molecular Weight (Mn)

The Mw and the Mn of the polymer were determined by gel permeation chromatography (GPC) using a high-performance GPC system (HLC-8120) and GPC columns (G2000HXL×2, G3000HXL×1, G4000HXL×1) manufactured by Tosoh Corporation (flow rate: 1.0 ml/min, eluant: tetrahydrofuran, column temperature: 40° C., standard: monodisperse polystyrene).

$^1$H-NMR Analysis and $^{13}$C-NMR Analysis

The polymer was subjected to $^1$H-NMR analysis and $^{13}$C-NMR analysis using a nuclear magnetic resonance spectrometer "JNM-EX270" (manufactured by JEOL Ltd.) (270 MHz) (internal standard: tetramethylsilane (TMS)).

Measurement of Receding Contact Angle of Polymer

The polymer solution prepared in each synthesis example was spin-coated onto an 8-inch silicon wafer, and prebaked (PB) on a hot plate at 90° C. for 60 seconds to form a film having a thickness of 30 nm. The receding contact angle was immediately measured by the following method at a temperature of 23° C. (room temperature) and a humidity of 45% under atmospheric pressure using a contact angle meter ("DSA-10" manufactured by KRUS).

Specifically, the position of the wafer stage of the contact angle meter was adjusted, and the wafer was placed on the stage. After injecting water into the needle, the position of the needle was adjusted to the initial position at which a water droplet can be formed on the wafer. A water droplet (25 μl) was formed on the wafer by discharging water to the wafer from the needle. After removing the needle from the water droplet, the needle was moved downward to the initial position, and introduced into the water droplet. The water droplet was sucked via the needle at 10 μl/min for 90 seconds, and the contact angle was measured every second (90 times in total). The average value of twenty measured values (20 seconds) after the measured value became stable was calculated, and taken as the receding contact angle)(°.

Synthesis of Monomer

A monomer that produces the structural unit (I) was synthesized as described below.

Monomer Synthesis Example 1: Synthesis of Monomer that Produces Structural Unit (1-17)

21.4 g of ethylene glycol monoacetoacetate monomethacrylate was dissolved in 200 ml of toluene. After the addition of 18.3 g of nitrogen-substituted diazabicycloundecene and 17.0 g of methyl iodide, the mixture was stirred at room temperature for 3 hours. Crystals produced in the reaction mixture were removed by filtration. After transferring the filtrate to a separating funnel, 200 ml of distilled water was added to the filtrate to wash the organic layer, and the aqueous layer was removed. After washing the organic layer with 200 ml of distilled water, the aqueous layer was removed. The resulting toluene solution was dried over anhydrous magnesium sulfate, and filtered. The filtrate was dried under reduced pressure to obtain a crude product (17 g). The crude product was purified by silica gel column chromatography (hexane/ethyl acetate=1/4 (volume ratio)) to obtain a monomer that produces the structural unit (1-17) (yield: 56%).

The $^1$H-NMR spectral data of the monomer is shown below.

δ (ppm): 1.35 (d, 3.0H), 1.94 (s, 3.0H), 2.24 (s, 3.0H), 3.54 (s, 1.0H), 4.38 (m, 4.0H), 5.60 (s, 1.0H), 6.12 (s, 1.0H)

Monomer Synthesis Example 2: Synthesis of Monomer that Produces Structural Unit (1-18)

A monomer that produces the structural unit (1-18) was synthesized in the same manner as in Monomer Synthesis Example 1, except that ethyl iodide was used instead of methyl iodide.

Monomer Synthesis Example 3: Synthesis of Monomer that Produces Structural Unit (1-23)

A monomer that produces the structural unit (1-23) was synthesized in the same manner as in Monomer Synthesis Example 1, except that acetyl chloride was used instead of methyl iodide.

Monomer Synthesis Example 4: Synthesis of Monomer that Produces Structural Unit (1-14)

110 ml of a 1 N sodium hydroxide aqueous solution was added to 15 g of ethyl 2-fluoroacetoacetate. The mixture was stirred at room temperature for 1 hour. 1 N hydrochloric acid was added to the mixture until the pH of the mixture reached 6. After transferring the reaction mixture to a separating funnel, the reaction mixture was extracted with 100 ml of methyl isobutyl ketone, and the aqueous layer was removed. The organic layer was then washed with 100 ml of a saturated sodium chloride solution. The resulting toluene solution was dried over anhydrous magnesium sulfate, and filtered. The filtrate was dried under reduced pressure to obtain 9 g of an oily product.

The oily product (9 g) was dissolved in 100 ml of toluene. After the addition of 13 g of oxalyl chloride, 10 g of triethylamine, and 1 g of dimethylformamide, the mixture was stirred at room temperature for 1 hour. After the addition of 13 g of 2-hydroxyethyl methacrylate, the mixture was stirred at room temperature for 3 hours. The reaction mixture was transferred to a separating funnel, and washed with a 1 N sodium hydroxide aqueous solution until the pH of the mixture reached 7. The resulting toluene solution was dried over anhydrous magnesium sulfate, and filtered. The filtrate was dried under reduced pressure to obtain a crude product. The crude product was purified by silica gel column chromatography (hexane/ethyl acetate=1/4 (volume ratio)) to obtain a monomer that produces the structural unit (1-14) (yield: 40%).

The $^1$H-NMR spectral data of the monomer is shown below.

δ (ppm): 1.96 (s, 3.0H), 2.22 (s, 3.0H), 3.74 (s, 1.0H), 4.39 (m, 4.0H), 5.61 (s, 1.0H), 6.17 (s, 1.0H)

Monomer Synthesis Examples 5 and 6: Synthesis of Monomer that Produces Structural Unit (1-5) and Monomer that Produces Structural Unit (1-20)

A monomer that produces the structural unit (1-5) or a monomer that produces the structural unit (1-20) was synthesized in the same manner as in Monomer Synthesis Example 4, except that the corresponding ethyl acetoacetate derivative was used instead of ethyl 2-fluoroacetoacetate.

Monomer Synthesis Example 7: Synthesis of Monomer that Produces Structural Unit (1-24)

110 ml of a 1 N sodium hydroxide aqueous solution was added to 15.2 g of methyl methanesulfonylacetate, and the mixture was stirred at room temperature for 3 hours. 1 N hydrochloric acid was added to the mixture until the pH of the mixture reached 6. After transferring the reaction mixture to a separating funnel, the reaction mixture was extracted with 200 ml of toluene, and the aqueous layer was removed. The organic layer was then washed with 100 ml of a saturated sodium chloride solution. The resulting toluene solution was dried over anhydrous magnesium sulfate, and filtered. The filtrate was dried under reduced pressure to obtain 9 g of an oily product.

The oily product (9 g) was dissolved in 100 ml of toluene. After the addition of 18 g of oxalyl chloride, 17 g of triethylamine, and 1 g of dimethylformamide, the mixture was stirred at room temperature for 1 hour. After the addition of 19 g of 2-hydroxyethyl methacrylate, the mixture was stirred at room temperature for 3 hours. The reaction mixture was transferred to a separating funnel, and washed with a 1 N sodium hydroxide aqueous solution until the pH of the mixture reached 7. The resulting toluene solution was dried over anhydrous magnesium sulfate, and filtered. The filtrate was dried under reduced pressure to obtain a crude product. The crude product was purified by silica gel column chromatography (hexane/ethyl acetate=1/4 (volume ratio)) to obtain a monomer that produces the structural unit (1-24) (yield: 45%).

The $^1$H-NMR spectral data of the monomer is shown below.

δ (ppm): 1.96 (s, 3.011), 2.22 (s, 3.011), 2.95 (s, 3.0H), 3.93 (s, 2.011), 4.39 (m, 4.0H), 5.61 (s, 1.011), 6.17 (s, 1.0H)

Monomer Synthesis Examples 8 and 9

Synthesis of Monomer that Produces Structural Unit (1-27) and Monomer that Produces Structural Unit (1-29)

A monomer that produces the structural unit (1-27) or a monomer that produces the structural unit (1-29) was synthesized in the same manner as in Monomer Synthesis Example 7, except that the corresponding methyl acetate derivative was used instead of methyl methanesulfonylacetate.

Synthesis of Polymer (A1)

Synthesis Example 1-1: Synthesis of Polymer (A1-1)

13.3 g (55.25 mol %) of 2-methacryloyloxyethyl hexahydrophthalate, 5.4 g (29.75 mol %) of ethylene glycol monoacetoacetate monomethacrylate (compound represented by the following formula (X-1) (compound that produces the structural unit (1-1)), 1.4 g (15 mol %) of vinylsulfonic acid, and 1.9 g of an initiator (2,2'-azobis (methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

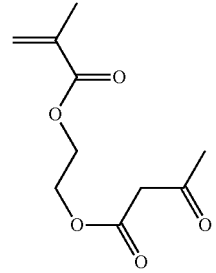

(X-1)

The polymer solution was added dropwise to 820 g of hexane to reprecipitate the polymer. The polymer was filtered off, and washed with 300 g of hexane for 30 minutes. The polymer was then dissolved in methylisobutylcarbinol (MIBC) to obtain 110 g of an MIBC polymer solution. After the addition of 55 g of methanol and 110 g of purified water to the MIBC polymer solution, the mixture was stirred for 30 minutes, and 120 g of the upper layer was collected. After the addition of methyl ethyl ketone and purified water in an amount equal to the amount of the upper layer, the mixture was stirred for 30 minutes. 150 g of the upper layer was then collected, and the solvent was replaced with 4-methyl-2-pentanol to obtain a solution containing a polymer (A1-1). 0.5 g of the polymer solution was placed on an aluminum dish, and the solid content in the solution containing the polymer (A1-1) was calculated from the mass of a residue obtained by heating the polymer solution on a hot plate at 155° C. for 30 minutes. The solid content thus calculated was used when preparing an upper layer film-forming composition, and calculating the yield. The polymer (A1-1) had an Mw of 5070 and a dispersity (Mw/Mn) of 1.6. The yield of the polymer (A1-1) was 80%. The molar ratio of structural units derived from 2-methacryloyloxyethyl hexahydrophthalate, structural units derived from ethylene glycol monoacetoacetate monomethacrylate, and structural units derived from vinylsulfonic acid was 62:33:5 (mol %). The receding contact angle with water measured when the polymer (A1-1) was formed into a film was 52°.

Synthesis Example 1-2: Synthesis of Polymer (A1-2)

A polymer solution was obtained in the same manner as in Synthesis Example 1-1, except that the monomer solution was prepared by dissolving 8.4 g (59.5 mol %) of methacrylic acid, 9.0 g (25 mol %) of ethylene glycol monoacetoacetate monomethacrylate (compound represented by the formula (X-1) (compound that produces the structural unit (1-1)), 2.7 g (15 mol %) of vinylsulfonic acid, and 3.8 g of an initiator (2,2'-azobis(methyl 2-methylpropionate)) in 20 g of isopropanol.

115 g of the upper layer of the polymer solution was collected in the same manner as in Synthesis Example 1-1. After the addition of 115 g of methyl ethyl ketone and 115 g of purified water to the upper layer, the mixture was stirred for 30 minutes. The solvent was replaced with 4-methyl-2- pentanol to obtain a solution containing a polymer (A1-2). The polymer (A1-2) had an Mw of 5240 and a dispersity (Mw/Mn) of 1.6. The yield of the polymer (A1-2) was 79%. The molar ratio of structural units derived from methacrylic acid, structural units derived from ethylene glycol monoacetoacetate monomethacrylate, and structural units derived from vinylsulfonic acid was 67:28:5 (mol %). The receding contact angle with water measured when the polymer (A1-2) was formed into a film was 50°.

Synthesis Example 1-3: Synthesis of Polymer (A1-3)

13.3 g (59.5 mol %) of 2-methacryloyloxyethyl hexahydrophthalate, 5.4 g (25.5 mol %) of the compound represented by the following formula (X-2) (compound that produces the structural unit (1-5)), 1.3 g (15 mol %) of vinylsulfonic acid, and 1.8 g of an initiator (2,2'-azobis (methyl 2-methylpropionate)) were dissolved in 40 g of isopropanol to prepare a monomer solution. A polymer solution was obtained in the same manner as in Synthesis Example 1-1, except that the monomer solution thus prepared was used.

The polymer solution was concentrated to 44 g, and transferred to a separating funnel. 44 g of methanol and 220 g of n-hexane were added to the separating funnel to effect separation and purification. The lower layer thus separated was collected. The solvent in the lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2-pentanol to obtain a solution containing a polymer (A1-3). The polymer (A1-3) had an Mw of 5300 and a dispersity (Mw/Mn) of 1.6. The yield of the polymer (A1-3) was 83%. The molar ratio of structural units derived from 2-methacryloyloxyethyl hexahydrophthalate, structural units derived from the compound represented by the formula (X-2), and structural units derived from vinylsulfonic acid was 67:28:5 (mol %). The receding contact angle with water measured when the polymer (A1-3) was formed into a film was 55° or less.

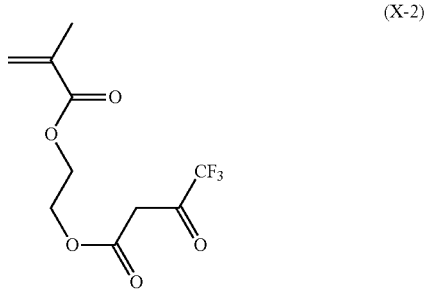

(X-2)

Synthesis Example 1-4: Synthesis of Polymer (A1-4)

8.5 g (40.0 mol %) of 2-(2-nitroacetoxy)ethyl methacrylate synthesized in Monomer Synthesis Example 9, 3.3 g (30.0 mol %) of ethyl methacrylate, 8.2 g (30.0 mol %) of 4,4,4-trifluoro-3-hydroxy-3-trifluoromethylbutyl methacrylate, and 2.2 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2-pentanol to obtain a solution containing a polymer (A1-4). The polymer (A1-4) had an Mw of 5070 and a dispersity (Mw/Mn) of 1.6. The yield of the polymer (A1-4) was 80%. The molar ratio of structural units derived from 2-(2-nitroacetoxy)ethyl methacrylate, structural units derived from ethyl methacrylate, and structural units derived from vinylsulfonic acid was 28:66:6 (mol %). The receding contact angle with water measured when the polymer (A1-4) was formed into a film was 55° or less.

Synthesis Example 1-5: Synthesis of Polymer (A1-5)

10.3 g (40.0 mol %) of 2-(methacryloyloxy)ethyl-2-acetyl-3-oxobutanoate synthesized in Monomer Synthesis Example 3, 8.4 g (30.0 mol %) of 4,4,4-trifluoro-3-hydroxy-3-trifluoromethylbutyl methacrylate, 2.6 g (30.0 mol %) of methacrylic acid, and 2.3 g of an initiator (2,2'-azobis (methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2- pentanol to obtain a solution containing a polymer (A1-5). The polymer (A1-5) had an Mw of 4990 and a dispersity (Mw/Mn) of 1.7. The yield of the polymer (A1-5) was 82%. The molar ratio of structural units derived from 2-(methacryloyloxy)ethyl-2-ethyl-2-acetyl-3-oxobutanoate, structural units derived from 4,4,4-trifluoro-3-hydroxy-3-trifluoromethylbutyl methacrylate, and structural units derived from methacrylic acid was 40:30:30 (mol %). The receding contact angle with water measured when the polymer (A1-5) was formed into a film was 55° or less.

Synthesis Example 1-6: Synthesis of Polymer (A1-6)

14.8 g (50.0 mol %) of 2-(methacryloyloxy)ethyl-2-ethyl-3-oxobutanoate synthesized in Monomer Synthesis Example 2, 5.2 g (50.0 mol %) of methacrylic acid, and 2.8 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2-pentanol to obtain a solution containing a polymer (A1-6). The polymer (A1-6) had an Mw of 5090 and a dispersity (Mw/Mn) of 1.9. The yield of the polymer (A1-6) was 82%. The molar ratio of structural units derived from 2-(methacryloyloxy)ethyl-2-ethyl-3-oxobutanoate and structural units derived from methacrylic acid was 50:50 (mol %). The receding contact angle with water measured when the polymer (A1-6) was formed into a film was 55° or less.

Synthesis Example 1-7: Synthesis of Polymer (A1-7)

4.8 g (25 mol %) of 2-(methacryloyloxy)ethyl-2-methyl-3-oxobutanoate synthesized in Monomer Synthesis Example 1, 13.8 g (59.5 mol %) of 4,4,4-trifluoro-3-hydroxy-3-trifluoromethylbutyl methacrylate, 1.4 g (15 mol %) of vinylsulfonic acid, and 1.9 g of an initiator (2,2'-azobis(methyl 2-methylpropionate) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 288 g of the upper layer was collected. After the addition of 144 g of methyl ethyl ketone and 288 g of purified water to the upper layer, the mixture was stirred for 30 minutes. After collecting 400 g of the upper layer, the solvent in the upper layer was replaced with 4-methyl-2-pentanol to obtain a solution containing a polymer (A1-7). The polymer (A1-7) had an Mw of 5080 and a dispersity (Mw/Mn) of 1.8. The yield of the polymer (A1-7) was 76%. The molar ratio of structural units derived from 2-(methacryloyloxy)ethyl-2-methyl-3-oxobutanoate, structural units derived from 4,4,4-trifluoro-3-hydroxy-3-trifluoromethylbutyl methacrylate, and structural units derived from vinylsulfonic acid was 28:66:6 (mol %). The receding contact angle with water measured when the polymer (A1-7) was formed into a film was 55° or less.

Synthesis Example 1-8: Synthesis of Polymer (A1-8)

8.8 g (50.0 mol %) of 2-(methacryloyloxy)ethyl-2-fluoro-3-oxobutanoate synthesized in Monomer Synthesis Example 2, 11.2 g (50.0 mol %) of (1,1,1-trifluoro-2-trifluoromethyl-2-hydroxy-4-pentyl) methacrylate, and 1.8 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent of the collected lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2-pentanol to obtain a solution containing a polymer (A1-8). The polymer (A1-8) had an Mw of 5100 and a dispersity (Mw/Mn) of 1.7. The yield of the polymer (A1-8) was 77%. The molar ratio of structural units derived from 2-(methacryloyloxy)ethyl-2-fluoro-3-oxobutanoate and structural units derived from (1,1,1-trifluoro-2-trifluoromethyl-2-hydroxy-4-pentyl) methacrylate was 50:50 (mol %). The receding contact angle with water measured when the polymer (A1-8) was formed into a film was 55° or less.

Synthesis Example 1-9: Synthesis of Polymer (A1-9)

7.0 g (30.0 mol %) of 2-(methacryloyloxy)ethyl-3-oxo-2-(trifluoromethyl)butanoate synthesized in Monomer Synthesis Example 6, 3.5 g (30.0 mol %) of n-butyl methacrylate, 9.4 g (40.0 mol %) of 2-methacryloyloxyethyl hexahydrophthalate, and 1.9 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent of the collected lower layer was replaced with 4-methyl-2-pentanol so that the total amount of the mixture was 256 g. 128 g of methanol and 256 g of purified water were added to effect separation and purification, and 280 g of the upper layer was collected. After the addition of 140 g of methyl ethyl ketone and 280 g of purified water to the upper layer, the mixture was stirred for 30 minutes. After collecting 400 g of the upper layer, the solvent in the upper layer was replaced with 4-methyl-2-pentanol to obtain a solution containing a polymer (A1-9). The polymer (A1-9) had an Mw of 5110 and a dispersity (Mw/Mn) of 1.6. The yield of the polymer (A1-9) was 79%. The molar ratio of structural units derived from 2-(methacryloyloxy)ethyl-3-oxo-2-(trifluoromethyl)butanoate, structural units derived from n-butyl methacrylate, and structural units derived from 2-methacryloyloxyethyl hexahydrophthalate was 30:30:40 (mol %). The receding contact angle with water measured when the polymer (A1-9) was formed into a film was 55° or less.

Synthesis Example 1-10: Synthesis of Polymer (A1-10)

14.9 g (50.0 mol %) of 2-(methacryloyloxy)ethyl-4,4,4-trifluoro-3-oxobutanoate synthesized in Monomer Synthesis Example 5, 4.3 g (45.0 mol %) of methacrylic acid, 0.8 g (5.0 mol %) of cyclohexyl acrylate, and 2.6 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 288 g of the upper layer was collected. After the addition of 144 g of methyl ethyl ketone and 288 g of purified water to the upper layer, the mixture was stirred for 30 minutes. After collecting 400 g of the upper layer, the solvent in the upper layer was replaced with 4-methyl-2-pentanol to obtain a solution containing a polymer (A1-10). The polymer (A1-10) had an Mw of 5250 and a dispersity (Mw/Mn) of 1.9. The yield of the polymer (A1-10) was 71%. The molar ratio of structural units derived from 2-(methacryloyloxy)ethyl-4,4,4-trifluoro-3-oxobutanoate, structural units derived from methacrylic acid, and structural units derived from cyclohexyl acrylate was 50:45:5 (mol %). The receding contact angle with water measured when the polymer (A1-10) was formed into a film was 55° or less.

Synthesis Example 1-11: Synthesis of Polymer (A1-11)

7.0 g (25.5 mol %) of 2-(2-(methylsulfonyl)acetoxy)ethyl methacrylate synthesized in Monomer Synthesis Example 7, 13.8 g (59.5 mol %) of 4,4,4-trifluoro-3-hydroxy-3-trifluoromethylbutyl methacrylate, 1.8 g (15 mol %) of vinylsulfonic acid, and 2.5 g of an initiator (2,2'-azobis(methyl 2-methylpropionate) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 288 g of the upper layer was collected. After the addition of 144 g of methyl ethyl ketone and 288 g of purified water to the upper layer, the mixture was stirred for 30 minutes. After collecting 400 g of the upper layer, the solvent in the upper layer was replaced with 4-methyl-2-pentanol to obtain a solution containing a polymer (A1-11). The polymer (A1-11) had an Mw of 5200 and a dispersity (Mw/Mn) of 1.8. The yield of the polymer (A1-11) was 75%. The molar ratio of structural units derived from 2-(2-(methylsulfonyl)acetoxy)ethyl methacrylate, structural units derived from 4,4,4-trifluoro-3-hydroxy-3-trifluoromethylbutyl methacrylate, and structural units derived from vinylsulfonic acid was 28:66:6 (mol %). The receding contact angle with water measured when the polymer (A1-7) was formed into a film was 55° or less.

Synthesis Example 1-12: Synthesis of Polymer (A1-12)

13.7 g (50.0 mol %) of 2-(2-cyanoacetoxy)ethyl methacrylate synthesized in Monomer Synthesis Example 8, 5.4 g (45.0 mol %) of methacrylic acid, 0.9 g (5.0 mol %) of hydroxyethyl methacrylate, and 3.2 g of an initiator (2,2'-azobis(methyl 2-methylpropionate)) were dissolved in 20 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 44 g, and transferred to a separating funnel. 44 g of methanol and 220 g of n-hexane were added to the separating funnel to effect separation and purification. The lower layer thus separated was collected. The solvent in the collected lower layer was replaced with 4-methyl-2-pentanol so that the total amount of the mixture was 256 g. 128 g of methanol and 256 g of purified water were added to effect separation and purification, and 288 g of the upper layer was collected. After the addition of 144 g of methyl ethyl ketone and 288 g of purified water to the upper layer, the mixture was stirred for 30 minutes. After collecting 400 g of the upper layer, the solvent in the upper layer was replaced with 4-methyl-2-pentanol to obtain a solution containing a polymer (A1-12). The polymer (A1-12) had an Mw of 5000 and a dispersity (Mw/Mn) of 1.9. The yield of the polymer (A1-12) was 78%. The molar ratio of structural units derived from 2-(2-cyanoacetoxy)ethyl methacrylate, structural units derived from methacrylic acid, and structural units derived from hydroxyethyl methacrylate was 28:66:6 (mol %). The receding contact angle with water measured when the polymer (A1-12) was formed into a film was 55° or less.

Synthesis of Polymer (A2)

Synthesis Example 2-1: Synthesis of Polymer (A2-1)

25 g of 2,2-azobis(methyl 2-methylisopropionate) was dissolved in 25.0 g of methyl ethyl ketone to prepare a solution. A three-necked flask (2000 ml) equipped with a thermometer and a dropping funnel was charged with 104.6 g of (1,1,1,3,3,3-hexafluoro-2-propyl) methacrylate, 195.4 g of (1,1,1-trifluoro-2-trifluoromethyl-2-hydroxy-4-pentyl) methacrylate, and 575.0 g of methyl ethyl ketone, and purged with nitrogen for 30 minutes. The inside of the flask was then heated to 80° C. with stirring using a magnetic stirrer.

The above solution was added dropwise to the flask over 5 minutes using the dropping funnel, and the mixture was aged for 360 minutes. The mixture was cooled to 30° C. or less to obtain a polymer solution.

The polymer solution was concentrated to 600 g, and transferred to a separating funnel. 193 g of methanol and 1542 g of n-hexane were added to the separating funnel to effect separation and purification. The lower layer thus separated was collected. 117 g of methyl ethyl ketone and 1870 g of n-hexane were added to the collected lower layer to effect separation and purification. The lower layer thus separated was collected. 93 g of methanol, 77 g of methyl ethyl ketone, and 1238 g of n-hexane were added to the collected lower layer to effect separation and purification. The lower layer thus separated was collected. The solvent in the collected lower layer was replaced with 4-methyl-2-pentanol. The solution was washed with distilled water, and the solvent was replaced with 4-methyl-2-pentanol to obtain a solution containing a polymer (A2-1). The solid content in the solution containing the polymer (A2-1) was determined by weighing 0.3 g of the polymer solution on an aluminum dish, heating the polymer solution at 140° C. for 1 hour on a hot plate, and calculating the solid content from the mass of the polymer solution before heating and the mass of the residue (after heating). The solid content was used when preparing an upper layer film-forming composition and calculating the yield.

The polymer (A2-1) had an Mw of 10,200 and a dispersity (Mw/Mn) of 1.65. The yield of the polymer (A2-1) was 65%. The molar ratio of structural units derived from (1,1,1,3,3,3-hexafluoro-2-propyl) methacrylate and structural units derived from (1,1,1-trifluoro-2-trifluoromethyl-2-hydroxy-4-pentyl) methacrylate was 39.5:60.5 (mol %). The receding contact angle with water measured when the polymer (A2-1) was formed into a film was 81°.

Synthesis Example 2-2: Synthesis of Polymer (A2-2)

9.1 g of 2,2-azobis(methyl 2-methylisopropionate) was dissolved in 9.0 g of methyl ethyl ketone to prepare a solution.

A three-necked flask (2000 ml) equipped with a thermometer and a dropping funnel was charged with 69.6 g of (1,1,1,3,3,3-hexafluoro-2-propyl) methacrylate, 130.4 g of (1,1,1-trifluoro-2-trifluoromethyl-2-hydroxy-4-pentyl) methacrylate, and 190.0 g of methyl ethyl ketone, and purged with nitrogen for 30 minutes. The inside of the flask was then heated to 80° C. with stirring using a magnetic stirrer.

The above solution was added dropwise to the flask over 5 minutes using the dropping funnel, and the mixture was aged for 360 minutes. The mixture was cooled to 30° C. or less to obtain a polymer solution.

The polymer solution was concentrated to 600 g, and transferred to a separating funnel. 191 g of methanol and 1543 g of n-hexane were added to the separating funnel to effect separation and purification. The lower layer thus separated was collected. 117 g of methyl ethyl ketone and 1870 g of n-hexane were added to the collected lower layer to effect separation and purification. The lower layer thus separated was collected. 93 g of methanol, 77 g of methyl ethyl ketone, and 1238 g of n-hexane were added to the collected lower layer to effect separation and purification. The lower layer thus separated was collected. The solvent in the collected lower layer was replaced with 4-methyl-2-pentanol. The solution was washed with distilled water, and the solvent was replaced with 4-methyl-2-pentanol to obtain a solution containing a polymer (A2-2). The polymer (A2-2) had an Mw of 10,600 and a dispersity (Mw/Mn) of 1.64. The yield of the polymer (A2-2) was 68%. The molar ratio of structural units derived from (1,1,1,3,3,3-hexafluoro-2-propyl) methacrylate and structural units derived from (1,1,1-trifluoro-2-trifluoromethyl-2-hydroxy-4-pentyl) methacrylate was 60.5:39.5 (mol %). The receding contact angle with water measured when the polymer (A2-2) was formed into a film was 84°.

Synthesis Example 2-3: Synthesis of Polymer (A2-3)

46.81 g (85 mol %) of (1,1,1-trifluoro-2-trifluoromethyl-2-hydroxy-4-butyl) methacrylate and 4.53 g of 2,2'-azobis (methyl 2-methylpropionate) (initiator) were dissolved in 40.00 g of isopropanol to prepare a monomer solution.

A three-necked flask (200 ml) equipped with a thermometer and a dropping funnel was charged with 50 g of isopropanol, and purged with nitrogen for 30 minutes. The inside of the flask was then heated to 80° C. with stirring using a magnetic stirrer.

The monomer solution was added dropwise to the flask over 2 hours using the dropping funnel. After the dropwise addition, the mixture was reacted for 1 hour. After the dropwise addition of 10 g of an isopropanol solution of 3.19 g (15 mol %) of vinylsulfonic acid to the flask over 30 minutes, the mixture was reacted for 1 hour, and cooled to 30° C. or less to obtain a polymer solution.

The polymer solution was concentrated to 150 g, and transferred to a separating funnel. 50 g of methanol and 600 g of n-hexane were added to the separating funnel to effect separation and purification. The lower layer thus separated was collected. The lower layer was diluted with isopropanol so that the amount was 100 g, and transferred to the separating funnel. 50 g of methanol and 600 g of n-hexane were added to the separating funnel to effect separation and purification, and the lower layer was collected. The solvent in the lower layer was replaced with 4-methyl-2-pentanol so that the total amount was 250 g. 250 g of water was added to the mixture to effect separation and purification, and the upper layer was collected. The solvent in the collected upper layer was replaced with 4-methyl-2-pentanol to obtain a solution containing a polymer (A2-3). The polymer (A2-3) had an Mw of 10,010 and a dispersity (Mw/Mn) of 1.55. The yield of the polymer (A2-3) was 75%. The molar ratio of structural units derived from (1,1,1-trifluoro-2-trifluoromethyl-2-hydroxy-4-butyl) methacrylate and structural units derived from vinylsulfonic acid was 98:2 (mol %). The receding contact angle with water measured when the polymer (A2-3) was formed into a film was 56°.

Synthesis Example 2-4: Synthesis of Polymer (A2-4)

46.95 g (85 mol %) of (1,1,1-trifluoro-2-trifluoromethyl-2-hydroxy-4-pentyl) methacrylate and 6.91 g of 2,2'-azobis (methyl 2-methylpropionate) (initiator) were dissolved in 100 g of isopropanol to prepare a monomer solution. A three-necked flask (500 ml) equipped with a thermometer and a dropping funnel was charged with 50 g of isopropanol, and purged with nitrogen for 30 minutes. The inside of the flask was then heated to 80° C. with stirring using a magnetic stirrer. The monomer solution was then added dropwise to the flask over 2 hours using the dropping funnel. After the dropwise addition, the mixture was reacted for 1 hour. After the dropwise addition of 10 g of an isopropanol solution of 3.05 g (15 mol %) of vinylsulfonic acid to the flask over 30 minutes, the mixture was reacted for 1 hour. The mixture was then cooled to 30° C. or less to obtain a polymer solution.

The polymer solution was concentrated to 150 g, and transferred to a separating funnel. 50 g of methanol and 600 g of n-hexane were added to the separating funnel to effect separation and purification. The lower layer thus separated was collected. The collected lower layer was diluted with isopropanol so that the amount was 100 g, and transferred to a separating funnel. 50 g of methanol and 600 g of n-hexane were added to the separating funnel to effect separation and purification. The lower layer thus separated was collected. The solvent in the collected lower layer was replaced with 4-methyl-2-pentanol so that the total amount was 250 g. 250 g of water was added to the mixture to effect separation and purification, and the upper layer was collected. The solvent in the collected upper layer was replaced with 4-methyl-2-pentanol to obtain a solution containing a polymer (A2-4). The polymer (A2-4) had an Mw of 9760 and a dispersity (Mw/Mn) of 1.51. The yield of the polymer (A2-4) was 65%. The molar ratio of structural units derived from (1,1,1-trifluoro-2-trifluoromethyl-2-hydroxy-4-pentyl) methacrylate and structural units derived from vinylsulfonic acid was 95:5 (mol %). The receding contact angle with water measured when the polymer (A2-4) was formed into a film was 69°.

Synthesis Example 3-1: Synthesis of Polymer (A'-1)

46.95 g (85 mol %) of 2-methacryloyloxyethyl hexahydrophthalate and 6.91 g of an initiator (2,2'-azobis(methyl 2-methylpropionate)) were dissolved in 100 g of isopropanol to prepare a monomer solution.

A three-necked flask (500 ml) equipped with a thermometer and a dropping funnel was charged with 50 g of isopropanol, and purged with nitrogen for 30 minutes. The inside of the flask was then heated to 80° C. with stirring using a magnetic stirrer.

The monomer solution was added dropwise to the flask over 2 hours using the dropping funnel. After the dropwise addition, the mixture was reacted for 1 hour. After the dropwise addition of 10 g of an isopropanol solution of 3.05 g (15 mol %) of vinylsulfonic acid to the flask over 30 minutes, the mixture was reacted for 1 hour, and cooled to 30° C. or less to obtain a copolymer solution.

The copolymer solution was concentrated to 150 g, and transferred to a separating funnel. 50 g of methanol and 600 g of n-hexane were added to the separating funnel to effect separation and purification. The lower layer thus separated was collected. The collected lower layer was diluted with isopropanol so that the amount was 100 g, and transferred to a separating funnel. 50 g of methanol and 600 g of n-hexane were added to the separating funnel to effect separation and purification, and the lower layer was collected. The solvent in the collected lower layer was replaced with 4-methyl-2-pentanol so that the total amount was 250 g. 250 g of water was added to the mixture to effect separation and purification, and the upper layer thus separated was collected. The solvent in the collected upper layer was replaced with 4-methyl-2-pentanol to obtain a solution containing a polymer (A'-1). The polymer (A'-1) had an Mw of 5600 and a dispersity (Mw/Mn) of 1.55. The yield of the polymer (A'-1) was 80%. The molar ratio of structural units derived from 2-methacryloyloxyethyl hexahydrophthalate and structural units derived from vinylsulfonic acid was 95:5 (mol %). The receding contact angle with water measured when the polymer (A'-1) was formed into a film was 50° or less.

Synthesis Example 3-2: Synthesis of Polymer (A'-2)

14 g (59.5 mol %) of 2-methacryloyloxyethyl hexahydrophthalate, 4.7 g (25 mol %) of tricyclodecyl methacrylate, 1.3 g (15 mol %) of vinylsulfonic acid, and 1.5 g of an initiator (2,2'-azobis(methyl 2-methylpropionate)) were dissolved in 40 g of isopropanol to prepare a monomer solution. A three-necked flask (200 ml) equipped with a thermometer and a dropping funnel was charged with 20 g of isopropanol, and purged with nitrogen for 30 minutes. The inside of the flask was then heated to 80° C. with stirring using a magnetic stirrer, and the monomer solution was added dropwise to the flask using the dropping funnel over 3 hours. After the dropwise addition, the mixture was reacted for 3 hours. The mixture was then cooled to 30° C. or less to obtain a polymer solution.

The polymer solution was concentrated to 11 g, and transferred to a separating funnel. 11 g of methanol and 55 g of n-hexane were added to the separating funnel to effect separation and purification. The lower layer thus separated was collected. The solvent in the collected lower layer was replaced with 4-methyl-2-pentanol so that the total amount was 64 g. 32 g of methanol and 64 g of purified water were added to effect separation and purification, and 70 g of the upper layer was collected. After the addition of 35 g of methyl ethyl ketone and 70 g of purified water to the upper layer, the mixture was stirred for 30 minutes. After collecting 100 g of the upper layer, the solvent in the upper layer was replaced with 4-methyl-2-pentanol to obtain a solution containing a polymer (A'-2). The polymer (A'-2) had an Mw of 5300 and a dispersity (Mw/Mn) of 1.6. The yield of the polymer (A'-2) was 83%. The molar ratio of structural units derived from 2-methacryloyloxyethyl hexahydrophthalate, structural units derived from tricyclodecyl methacrylate, and structural units derived from vinylsulfonic acid was 61:24:3 (mol %). The receding contact angle with water measured when the polymer (A'-2) was formed into a film was 52°.

Production of Immersion Upper Layer Film-Forming Composition

The following solvents [B] were used to prepare the immersion upper layer film-forming composition.
Solvent [B]
(B-1): 4-methyl-2-pentanol
(B-2): diisoamyl ether Example 1

90 parts of the polymer (A1-1) (polymer (A1)) (polymer component [A]), 10 parts of the polymer (A2-1) (polymer (A2)) (polymer component [A]), 1680 parts of the solvent (B-1) (solvent [B]), and 1120 parts of the solvent (B-2) (solvent [B]) were mixed. The mixture was stirred for 2 hours, and filtered through a filter having a pore size of 200 nm to obtain an immersion upper layer film-forming composition.

Examples 2 to 13 and Comparative Examples 1 to 6

An immersion upper layer film-forming composition was prepared in the same manner as in Example 1, except that the type and the amount of each component were changed as shown in Table 1.

TABLE 1

| | Polymer component [A] | | | | | | | | Solvent [B] | |
|---|---|---|---|---|---|---|---|---|---|---|
| | Polymer (A1) | | Polymer (A2) | | | | Polymer (A') | | | |
| | Type | Parts | Type | Parts | Type | Parts | Type | Parts | Type | Parts |
| Example 1 | A1-1 | 90 | A2-1 | 10 | — | — | — | — | B-1/B-2 | 1680/1120 |
| Example 2 | A1-1 | 70 | A2-1 | 30 | — | — | — | — | B-1/B-2 | 1680/1120 |
| Example 3 | A1-2 | 90 | A2-1 | 10 | — | — | — | — | B-1/B-2 | 1680/1120 |
| Example 4 | A1-3 | 90 | A2-1 | 10 | — | — | — | — | B-1/B-2 | 1680/1120 |
| Example 5 | A1-4 | 20 | A2-1 | 15 | A2-3 | 65 | — | — | B-1/B-2 | 560/2240 |
| Example 6 | A1-5 | 30 | A2-2 | 8 | A2-4 | 62 | — | — | B-1/B-2 | 560/2240 |
| Example 7 | A1-6 | 30 | A2-2 | 8 | A2-4 | 62 | — | — | B-1/B-2 | 560/2240 |
| Example 8 | A1-7 | 40 | A2-1 | 20 | A2-3 | 40 | — | — | B-1/B-2 | 560/2240 |
| Example 9 | A1-8 | 40 | A2-1 | 20 | A2-3 | 40 | — | — | B-1/B-2 | 560/2240 |
| Example 10 | A1-9 | 20 | A2-2 | 8 | A2-4 | 72 | — | — | B-1/B-2 | 560/2240 |
| Example 11 | A1-10 | 20 | A2-1 | 15 | A2-4 | 65 | — | — | B-1/B-2 | 560/2240 |
| Example 12 | A1-11 | 20 | A2-1 | 15 | A2-4 | 65 | — | — | B-1/B-2 | 560/2240 |
| Example 13 | A1-12 | 20 | A2-1 | 15 | A2-4 | 65 | — | — | B-1/B-2 | 560/2240 |
| Comparative Example 1 | — | — | A2-1 | 10 | — | — | A'-1 | 90 | B-1/B-2 | 1680/1120 |
| Comparative Example 2 | — | — | A2-1 | 10 | — | — | A'-2 | 90 | B-1/B-2 | 1680/1120 |
| Comparative Example 3 | — | — | A2-1 | 15 | A2-3 | 85 | — | — | B-1/B-2 | 560/2240 |
| Comparative Example 4 | — | — | A2-1 | 15 | — | — | A'-1 | 85 | B-1/B-2 | 560/2240 |
| Comparative Example 5 | — | — | A2-1 | 15 | — | — | A'-1 | 85 | B-1/B-2 | 2240/560 |
| Comparative Example 6 | — | — | A2-1 | 15 | — | — | A'-2 | 85 | B-1/B-2 | 1680/1120 |

Preparation of Photoresist Composition

A photoresist composition for forming a photoresist film was prepared as described below.

Synthesis of Photoresist Composition Polymer [P]

Synthesis Example 3-1

53.93 g (50 mol %) of the compound (M-1), 35.38 g (40 mol %) of the compound (M-2), and 10.69 g (10 mol %) of the compound (M-3) were dissolved in 200 g of 2-butanone, and 5.58 g of dimethyl 2,2'-azobis(2-methylpropionate) was dissolved in the solution to prepare a monomer solution. A three-necked flask (500 ml) was charged with 100 g of 2-butanone, and purged with nitrogen for 30 minutes. The flask was then heated to 80° C. with stirring, and the monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 2000 g of methanol. A white powder that precipitated was filtered off. The white powder thus collected was washed twice with 400 g of methanol in a slurry state, filtered off, and dried at 50° C. for 17 hours to obtain a white powdery polymer (P-1) (74 g, yield: 74%). The polymer (P-1) had an Mw of 6900 and a dispersity (Mw/Mn) of 1.70. The ratio of structural units derived from the compound (M-1), structural units derived from the compound (M-12), and structural units derived from the compound (M-3) determined by $^{13}$C-NMR analysis was 53.0:37.2:9.8 (mol %). The content of low-molecular-weight components derived from each monomer in the polymer was 0.03 mass %.

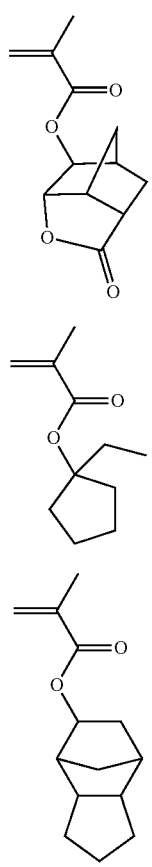

Preparation of Photoresist Composition (α)

The acid generator [Q], the acid diffusion controller (R), and the solvent (S) used when preparing the photoresist composition (α) are shown below.

Acid Generator [Q]
Q-1: triphenylsulfonium nonafluoro-n-butanesulfonate
Q-2: 1-(4-n-butoxynaphthalen-1-yl)tetrahydrothiophenium nonafluoro-n-butanesulfonate
Acid Diffusion Controller [R]
R-1: R-(+)-(tert-butoxycarbonyl)-2-piperidinemethanol
Solvent [S]
S-1: propylene glycol monomethyl ether acetate
S-2: cyclohexanone
S-3: γ-butyrolactone Synthesis Example 3-2

100 parts by mass of the polymer (P-1) (polymer [P]), 1.5 parts by mass of the acid generator (Q-1) (acid generator [Q]), 6 parts by mass of the acid generator (Q-2) (acid generator [Q]), and 0.65 parts by mass of the acid diffusion controller (R-1) (acid diffusion controller [R]) were mixed. After the addition of 2900 parts by mass of the solvent (S-1) (solvent [S]), 1250 parts by mass of the solvent (S-2) (solvent [S]), and 100 parts by mass of the solvent (S-3) (solvent [S]) to the mixture, the total solid content was adjusted to 5 mass %. The mixture was filtered through a filter having a pore size of 30 nm to obtain a photoresist composition (α).

Evaluation

An immersion upper layer film was formed using the immersion upper layer film-forming composition obtained as described above (Examples 1 to 13 and Comparative Examples 1 to 6), and evaluated as described below. The evaluation results are shown in Table 2. Note that the sign "-" in Table 2 indicates that the corresponding evaluation was not performed.

(1) Solubility

The immersion upper layer film-forming composition was stirred for 30 minutes. The immersion upper layer film-forming composition was then observed with the naked eye to evaluate the solubility of the composition. The solubility was evaluated as "A" when the composition was not cloudy, and evaluated as "B" when the composition was cloudy. Note that the remaining evaluation tests were not performed when the solubility was evaluated as "B".

(2) Removability of Upper Layer Film

The immersion upper layer film-forming composition was spin-coated onto an 8-inch silicon wafer using a coater/developer ("CLEAN TRACK ACT 8" manufactured by Tokyo Electron Ltd.), and prebaked (PB) at 90° C. for 60 seconds to form a film having a thickness of 90 nm. The thickness of the film was measured using a spectrometric film thickness measurement system ("Rambda Ace VM-90" manufactured by Dainippon Screen Mfg. Co., Ltd.). The film was subjected to puddle development (developer: 2.38% TMAH aqueous solution) for 60 seconds using the coater/developer, and spin-dried, and the surface of the wafer was observed. The removability of the upper layer film was evaluated as "A" when no residue was observed, and evaluated as "B" when a residue was observed.

(3) Receding Contact Angle

The upper layer film-forming composition was spin-coated onto an 8-inch silicon wafer, and prebaked (PB) at 90° C. for 60 seconds on a hot plate to form a film (upper layer film) having a thickness of 30 nm. The receding contact angle was immediately measured by the following method at a temperature of 23° C. (room temperature) and a humidity of 45% under atmospheric pressure using a contact angle meter ("DSA-10" manufactured by KRUS).

The position of the wafer stage of the contact angle meter was adjusted, and the wafer was placed on the stage. After injecting water into the needle, the position of the needle was adjusted to the initial position at which a water droplet can be formed on the wafer. A water droplet (25 μl) was formed on the wafer by discharging water to the wafer from the needle. After removing the needle from the water droplet, the needle was moved downward to the initial position, and introduced into the water droplet. The water droplet was sucked via the needle for 90 seconds at a rate of 10 μl/min, and the contact angle was measured every second (90 times in total). The average value of twenty measured values (20 seconds) after the measured value became stable was calculated, and taken as the receding contact angle (°).

(4) Elution Resistance

The elution volume from the resist film was evaluated. A silicone rubber sheet (manufactured by Kureha Elastomer Co., Ltd., thickness: 1.0 mm, shape: square (30×30 cm) having a center opening (diameter: 11.3 cm) was placed at the center of an 8-inch silicon wafer that had been subjected to hexamethyldisilazane (HMDS) treatment (100° C., 60 seconds) using a coater/developer ("CLEAN TRACK ACT8" manufactured by Tokyo Electron, Ltd.). The center opening of the silicone rubber sheet was filled with 10 ml of ultrapure water using a 10 ml whole pipette.

An 8-inch silicon wafer on which an underlayer antireflective film, a resist film, and an upper layer film were formed, was separately provided. The 8-inch silicon wafer was placed on the silicone rubber sheet so that the upper layer film came in contact with the silicone rubber sheet (i.e., the upper layer film came in contact with ultrapure water such that leakage did not occur).

Note that the underlayer antireflective film, the resist film, and the upper layer film were formed on the 8-inch silicon wafer as described below. An underlayer antireflective film-forming composition ("ARC29A" manufactured by Brewer Science) was applied to the 8-inch silicon wafer using the coater/developer to form a film having a thickness of 77 nm. The photoresist composition (a) was spin-coated onto the underlayer antireflective film using the coater/developer, and baked at 115° C. for 60 seconds to form a resist film having a thickness of 205 nm. The immersion upper layer film-forming composition was applied to the resist film to form an upper layer film.

The 8-inch silicon wafer placed on the silicone rubber sheet was allowed to stand for 10 seconds. After removing the 8-inch silicon wafer, ultrapure water was collected using a glass syringe to obtain an analysis sample. The ultrapure water collection rate after completion of the experiment was 95% or more.

The peak intensity of the anion moiety of the photoacid generator in the collected ultrapure water was measured using a liquid chromatography-mass spectrometry (LC-MS) system (LC: "SERIES 1100" manufactured by Agilent, MS: "Mariner" manufactured by Perseptive Biosystems, Inc.) under the following conditions. The peak intensities of aqueous solutions (1 ppb, 10 ppb, and 100 ppb) of the photoacid generator used for the photoresist composition ($\alpha$) were measured under the above conditions to draw a calibration curve. The elution volume of the photoacid generator was calculated from the measured peak intensity using the calibration curve. The peak intensities of aqueous solutions (1 ppb, 10 ppb, and 100 ppb) of the acid diffusion controller were measured under the following conditions to draw a calibration curve. The elution volume of the acid diffusion controller was calculated from the measured peak intensity using the calibration curve. The elution resistance was evaluated as "A" when the elution volume was $5.0 \times 10^{-12}$ mol/cm$^2$ or less, and evaluated as "B" when the elution volume was more than $5.0 \times 10^{-12}$ mol/cm$^2$.

Measurement Conditions
Column: CAPCELL PAK MG (×1) (manufactured by Shiseido Co., Ltd.)
Flow rate: 0.2 ml/min
Eluant: Mixture prepared by adding 0.1 mass % of formic acid to water-methanol (3:7) mixture
Column temperature: 35° C.

(5) Storage Stability

The immersion upper layer film-forming composition was stored at 5° C. for 2 weeks after confirming that the number of foreign substances having a particle size of 0.15 micrometers or less was 100 or less per 10 ml using a particle counter ("KE-40" manufactured by RION). The number of foreign substances in the composition was measured again after storage using the particle counter. The storage stability was evaluated as "A" when the number of foreign substances having a particle size of 0.15 micrometers or less was 100 or less per 10 ml, and evaluated as "B" when the number of foreign substances having a particle size of 0.15 micrometers or less was more than 100 per 10 ml.

(6) Blob Defects

An 8-inch silicon wafer was subjected to hexamethyldisilazane (HMDS) treatment at 100° C. for 60 seconds using a coater/developer ("CLEAN TRACK ACT 12" manufactured by Tokyo Electron, Ltd.). The photoresist composition ($\alpha$) was spin-coated onto the 8-inch silicon wafer, and prebaked (PB) at 90° C. for 60 seconds on a hot plate to form a film having a thickness of 120 nm. The immersion upper layer film-forming composition was spin-coated onto the resulting film, and prebaked (PB) at 90° C. for 60 seconds (or at 110° C. for 60 seconds) to form a film (upper layer film) having a thickness of 30 nm. The 8-inch silicon wafer was then exposed via frosted glass on which a pattern was not formed. Blob defects were measured using the exposed 8-inch silicon wafer.

Ultrapure water was discharged (60 seconds) to the upper layer film formed on the 8-inch silicon wafer through the rinse nozzle of the coater/developer ("CLEAN TRACK ACT 8"), and the wafer was spin-dried at 4000 rpm for 15 seconds. The wafer was then subjected to puddle development using the LD nozzle of the coater/developer ("CLEAN TRACK ACT 8") to remove the upper layer film. A 2.38% TMAH aqueous solution was used as the developer for puddle development. The degree by which the upper layer film remained undissolved after development was measured using a defect inspection system ("KLA2351" manufactured by KLA-Tencor) to measure blob defects. A case where the number of blob defects was 200 or less was evaluated as "A", and a case where the number of blob defects was more than 200 was evaluated as "B".

(7) Bridge Defects

An underlayer antireflective film-forming composition ("ARC66" manufactured by Nissan Chemical Industries, Ltd.) was spin-coated onto a 12-inch silicon wafer using a system "Lithius Pro-i", and prebaked (PB) to form a film having a thickness of 105 nm. The photoresist composition (a) was spin-coated onto the resulting film using a coater/developer ("CLEAN TRACK ACT 12" manufactured by Tokyo Electron, Ltd.), pre-baked (PB) at 100° C. for 60 seconds, and cooled at 23° C. for 30 seconds to form a resist film having a thickness of 100 nm. The immersion upper layer film-forming composition was applied to the resist film to form an upper layer film.

The 12-inch silicon wafer was then exposed via a mask for projecting a 45 nm line/90 nm pitch pattern using an ArF immersion scanner ("S610C" manufactured by Nikon Corporation) (NA: 1.30, Crosspole). Note that the dimensions of the pattern projected via a mask is referred to as the pattern dimensions of the mask. For example, a mask having 40 nm line/84 nm pitch pattern dimensions is a mask for projecting a 45 nm line/84 nm pitch pattern. The 12-inch silicon wafer was subjected to PEB at 100° C. for 60 seconds on the hot plate of the system "Lithius Pro-i", cooled at 23° C. for 30 seconds, subjected to puddle development for 10 seconds using a 2.38% TMAH aqueous solution by utilizing the GP nozzle of the development cup, and rinsed with ultrapure water. The 12-inch silicon wafer was then spin-dried at 2000 rpm for 15 seconds to obtain a substrate on which a resist pattern was formed. A dose at which a 45 nm line/90 nm pitch resist pattern was formed using a mask having 45 nm line/90 nm pitch pattern dimensions was taken as an optimum dose. A case where bridge defects were not observed when forming the 45 nm line/90 nm pitch resist pattern was evaluated as "A", and a case where bridge defects were observed when forming the 45 nm line/90 nm pitch resist pattern was evaluated as "B".

(8) Separation Resistance

An 8-inch silicon wafer that was not subjected to HMDS treatment was used as a substrate. The immersion upper layer film-forming composition was spin-coated onto the substrate using a coater/developer ("CLEAN TRACK ACT 8" manufactured by Tokyo Electron, Ltd.), and prebaked (PB) at 90° C. for 60 seconds to form an immersion upper layer film having a thickness of 30 nm. The substrate was rinsed with ultrapure water for 60 seconds using the coater/developer, and spin-dried. A case where separation was not observed with the naked eye after rinsing at the center of the substrate was evaluated as "A", a case where separation was observed with the naked eye after rinsing only at the edge of the substrate was evaluated as "B", and a case where separation was observed with the naked eye after rinsing at the center of the substrate was evaluated as "C".

(9) Coating Amount

A 12-inch silicon wafer was subjected to hexamethyldisilazane (HMDS) treatment at 100° C. for 60 seconds using a coater/developer ("CLEAN TRACK ACT 12" manufactured by Tokyo Electron, Ltd.). A given amount of the upper layer film-forming composition was spin-coated onto the 12-inch silicon wafer using the small dispensing unit of the coater/developer while rotating the wafer, and prebaked (PB) at 90° C. for 60 seconds to form a film having a thickness of 30 nm. The wafer (three wafers) was then observed with the naked eye to determine the minimum coating amount that did not cause striation. A case where the minimum coating amount was less than 1 cc was evaluated as "A"; and a case where the minimum coating amount was 2 cc or less was evaluated as "B".

As is clear from the results shown in Table 2, the immersion upper layer film-forming compositions of Example 1 to 13 could form an upper layer film which exhibited a high receding contact angle (i.e., high water repellency) and for which bridge defects, formation of foreign substance with the passage of time, separation, and the like could be suppressed in a well-balanced manner, as compared with the compositions of Comparative Examples 1 to 6. The receding contact angle could be further improved, and excellent applicability (i.e., a reduction in coating amount) could be achieved when using the immersion upper layer film-forming compositions of Examples 5 to 13.

INDUSTRIAL APPLICABILITY

The immersion upper layer film-forming composition according to the embodiments of the invention can form an immersion upper layer film that exhibits excellent water repellency and excellent solubility in a developer in a well-balanced manner, and suppresses defects in a resist. Therefore, the immersion upper layer film-forming composition may suitably be used for the production of semiconductor devices that are expected to be further miniaturized in the future.

The invention claimed is:

1. An immersion upper layer film-forming composition comprising:

[A] a polymer component that comprises:

a structural unit (I-1) represented by formula (1), the structural unit (I-1) being included in a polymer (A1);

a structural unit (II-1-2) represented by formula (2-2); and

TABLE 2

| | Solubility | Removability of upper layer film | Receding contact angle (°) | Elution resistance | Storage stability | Blob defects | Bridge defects | Separation resistance | Coating amount |
|---|---|---|---|---|---|---|---|---|---|
| Example 1 | A | A | 73.0 | A | A | A | A | A | B |
| Example 2 | A | A | 76.2 | A | A | A | A | A | B |
| Example 3 | A | A | 73.5 | A | A | A | A | A | B |
| Example 4 | A | A | 73.0 | A | A | A | A | A | B |
| Example 5 | A | A | 77.2 | A | B | B | A | A | A |
| Example 6 | A | A | 77.5 | A | B | A | A | A | A |
| Example 7 | A | A | 76.9 | A | A | B | A | A | A |
| Example 8 | A | A | 78.3 | A | A | A | A | A | A |
| Example 9 | A | A | 78.4 | A | A | A | A | B | A |
| Example 10 | A | A | 76.8 | A | A | A | A | B | A |
| Example 11 | A | A | 77.1 | A | A | A | A | A | A |
| Example 12 | A | A | 78.2 | A | A | A | A | A | A |
| Example 13 | A | A | 78.0 | A | A | A | A | A | A |
| Comparative Example 1 | A | A | 60.3 | A | A | A | A | A | B |
| Comparative Example 2 | A | A | 73.8 | A | A | A | B | A | B |
| Comparative Example 3 | A | A | 75.0 | A | A | A | A | C | A |
| Comparative Example 4 | B | — | — | — | — | — | — | — | — |
| Comparative Example 5 | A | A | 60.3 | A | A | A | A | A | B |
| Comparative Example 6 | A | A | 60.5 | A | B | B | B | A | B | optionally a structural unit (II-1-1) represented by formula (2-1), the structural unit (II-1-1) and the structural unit (II-1-2) being included in the polymer (A1) or a polymer other than the polymer (A1); and [B] a solvent, wherein a content of the structural unit (I-1) in the polymer component [A] is from 0.5 to 50 mol % based on total structural units included in the polymer component [A],

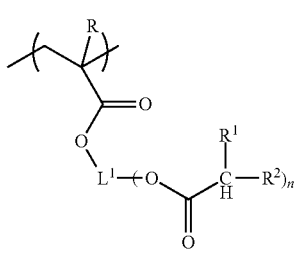

(1)

wherein
R$^1$ is a hydrogen atom,
R$^2$ is —C(=O)—R$^{3f}$, —S(=O)$_2$—R$^4$, or —R$^6$—NO$_2$, wherein R$^{3f}$ is a fluoroalkyl group, R$^4$ is a hydrogen atom, an alkyl group, a fluoroalkyl group, a monovalent alicyclic hydrocarbon group, an alkoxy group, a cyano group, a cyanomethyl group, an aralkyl group, or an aryl group, or R$^4$ and R$^1$ taken together represent a cyclic structure, and R$^6$ is a single bond, a methylene group, or an alkylene group having 2 to 5 carbon atoms,
n is an integer from 1 to 3, in a case where R$^1$ is present in a plurality of number, the plurality of R$^1$s are each identical or different, and in a case where R$^2$ is present in a plurality of number, the plurality of R$^2$s are each identical or different,
L$^1$ is an (n+1)-valent linking group, and
R is a hydrogen atom, a methyl group, a fluorine atom, or a trifluoromethyl group,

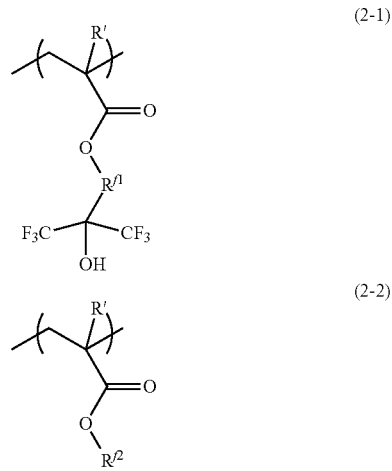

wherein R' is a hydrogen atom, a methyl group, a fluorine atom, or a trifluoromethyl group, R$^{f1}$ is a divalent linking group, and R$^{f2}$ is a linear or branched monovalent fluorohydrocarbon group having 2 to 8 carbon atoms or a monovalent alicyclic fluorohydrocarbon group having 4 to 8 carbon atoms.

2. The immersion upper layer film-forming composition according to claim 1, wherein the polymer component [A] further comprises a structural unit (III) that comprises a carboxyl group, the structural unit (III) being included in the polymer (A1) or a polymer other than the polymer (A1).

3. The immersion upper layer film-forming composition according to claim 1, wherein the polymer component [A] further comprises a structural unit (IV) that comprises a sulfo group, the structural unit (IV) being included in the polymer (A1) or a polymer other than the polymer (A1).

4. The immersion upper layer film-forming composition according to claim 1, wherein the solvent [B] comprises an ether solvent.

5. The immersion upper layer film-forming composition according to claim 1, wherein the content of the structural unit (I-1) in the polymer component [A] is from 1 to 45 mol % based on total structural units included in the polymer component [A].

6. The immersion upper layer film-forming composition according to claim 1, wherein the content of the structural unit (I-1) in the polymer component [A] is from 3 to 40 mol % based on total structural units included in the polymer component [A].

7. The immersion upper layer film-forming composition according to claim 1, wherein a total content of the structural unit (II-1-1) and the structural unit (II-1-2) in the polymer component [A] is from 10 to 99 mol % based on total structural units included in the polymer component [A].

8. The immersion upper layer film-forming composition according to claim 1, wherein a total content of the structural unit (II-1-1) and the structural unit (II-1-2) in the polymer component [A] is from 20 to 97 mol % based on total structural units included in the polymer component [A].

9. A polymer comprising:
a structural unit (I-1) represented by formula (1);
a structural unit (II-1-2) represented by formula (2-2); and
optionally a structural unit (II-1-1) represented by formula (2-1),
wherein a content of the structural unit (I-1) in the polymer is from 0.5 to 50 mol % based on total structural units included in the polymer,

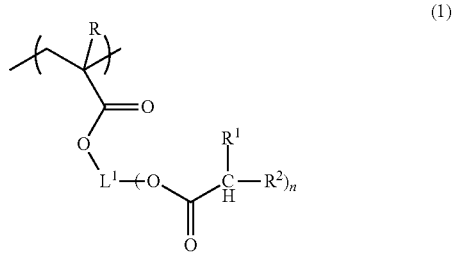

(1)

wherein R$^1$ is a hydrogen atom, R$^2$ is —C(=O)—R$^{3f}$, —S(=O)$_2$—R$^4$, or —R$^6$—NO$_2$, wherein R$^{3f}$ is a fluoroalkyl group, R$^4$ is a hydrogen atom, an alkyl group, a fluoroalkyl group, a monovalent alicyclic hydrocarbon group, an alkoxy group, a cyano group, a cyanomethyl group, an aralkyl group, or an aryl group, or R$^4$ and R$^1$ taken together represent a cyclic structure, and R$^6$ is a single bond, a methylene group, or an alkylene group having 2 to 5 carbon atoms, n is an integer from 1 to 3, in a case where R$^1$ is present in a plurality of number, the plurality of R$^1$s are each identical or different, and in a case where R$^2$ is present in a plurality of number, the plurality of $R^2$s are each identical or different, $L^1$ is an (n+1)-valent linking group, and R is a hydrogen atom, a methyl group, a fluorine atom, or a trifluoromethyl group,

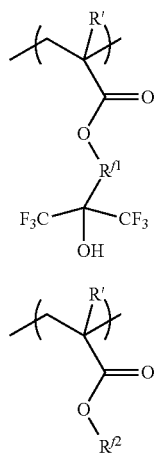

(2-1)

(2-2)

wherein R' is a hydrogen atom, a methyl group, a fluorine atom, or a trifluoromethyl group, $R^{f1}$ is a divalent linking group, and $R^{f2}$ is a linear or branched monovalent fluorohydrocarbon group having 2 to 8 carbon atoms or a monovalent alicyclic fluorohydrocarbon group having 4 to 8 carbon atoms.

10. The polymer according to claim 9, further comprising a structural unit (III) that comprises a carboxyl group.

11. The polymer according to claim 9, further comprising a structural unit (IV) that comprises a sulfo group.

12. The polymer according to claim 9, wherein the content of the structural unit (I-1) in the polymer is from 1 to 45 mol % based on total structural units included in the polymer.

13. The polymer according to claim 9, wherein the content of the structural unit (I-1) in the polymer is from 3 to 40 mol % based on total structural units included in the polymer.

14. The polymer according to claim 9, wherein a total content of the structural unit (II-1-1) and the structural unit (II-1-2) in the polymer is from 10 to 99 mol % based on total structural units included in the polymer.

15. The polymer according to claim 9, wherein a total content of the structural unit (II-1-1) and the structural unit (II-1-2) in the polymer is from 20 to 97 mol % based on total structural units included in the polymer.

* * * * *